US012808910B2

(12) United States Patent
Wagner et al.

(10) Patent No.: US 12,808,910 B2
(45) Date of Patent: Nov. 24, 2026

(54) METHOD FOR CONTACTLESS DETERMINATION OF AN OPERATING STATE

(71) Applicant: KAESER KOMPRESSOREN SE, Coburg (DE)

(72) Inventors: Florian Wagner, Coburg (DE); Tobias Sprügel, Coburg (DE); Patrick Jahn, Coburg (DE)

(73) Assignee: KAESER KOMPRESSOREN SE, Coburg (DE)

( * ) Notice: Subject to any disclaimer, the term of this patent is extended or adjusted under 35 U.S.C. 154(b) by 182 days.

(21) Appl. No.: 18/762,980

(22) Filed: Jul. 3, 2024

(65) Prior Publication Data

US 2025/0027977 A1 Jan. 23, 2025

Related U.S. Application Data

(63) Continuation of application No. 17/527,665, filed on Nov. 16, 2021, now Pat. No. 12,061,220, which is a (Continued)

(51) Int. Cl.
*G01R 23/16* (2006.01)
*G01R 15/18* (2006.01)
(Continued)

(52) U.S. Cl.
CPC ........... *G01R 23/16* (2013.01); *G01R 15/181* (2013.01); *G06F 17/14* (2013.01); *H01F 7/0294* (2013.01)

(58) Field of Classification Search
None
See application file for complete search history.

(56) References Cited

U.S. PATENT DOCUMENTS

2007/0075703 A1* 4/2007 Biber ........................ G01P 3/44 324/179
2008/0174255 A1 7/2008 Schnetzka et al.
(Continued)

FOREIGN PATENT DOCUMENTS

EP 3143418 B1 6/2018
WO 2013093800 A1 6/2013
WO 2021074248 A1 4/2021

OTHER PUBLICATIONS

Indian Office Action for corresponding application 202327071647; Report dated Sep. 1, 2026.

*Primary Examiner* — Lina Cordero
(74) *Attorney, Agent, or Firm* — CANTOR COLBURN LLP

(57) ABSTRACT

The disclosure relates to a method for determination of an operating state of a compressor and/or a rotational speed of a compressor drive of the compressor comprising; measuring, over a time range, a magnetic field associated with one or more phases of an electrical power supply conductor supplying the compressor with electrical power; wherein the magnetic field is measured by a detection element to provide a representation of the magnetic field; determining a frequency spectrum of the representation of the magnetic field over the time range; and analyzing the frequency spectrum of the representation of the magnetic field over the time range to determine an operating state of the compressor and/or to determine a rotational speed of the compressor drive. The disclosure further relates to a device for carrying out the method, a compressor measuring system, and a computer-readable storage medium.

20 Claims, 14 Drawing Sheets

Related U.S. Application Data continuation of application No. PCT/EP2021/066090, filed on Jun. 15, 2021, and a continuation of application No. PCT/EP2021/060955, filed on Apr. 27, 2021.

(51) Int. Cl.
*G06F 17/14* (2006.01)
*H01F 7/02* (2006.01)

(56) References Cited

U.S. PATENT DOCUMENTS

| | | | |
|---|---|---|---|
| 2015/0308859 | A1 | 10/2015 | Lerchenmueller |
| 2018/0045784 | A1 | 2/2018 | Gajanayake et al. |
| 2020/0033411 | A1 | 1/2020 | Tabuchi et al. |
| 2020/0088795 | A1 | 3/2020 | Kassab |
| 2021/0018542 | A1 | 1/2021 | Bates et al. |
| 2021/0165045 | A1 | 6/2021 | Kubo et al. |
| 2022/0309513 | A1 | 9/2022 | Shinar et al. |

* cited by examiner

METHOD FOR CONTACTLESS DETERMINATION OF AN OPERATING STATE

CROSS REFERENCE TO RELATED APPLICATIONS

This application is a continuation of U.S. patent application Ser. No. 17/527,665 filed on Nov. 16, 2021, which is a continuation of International Patent Application Number PCT/EP2021/060955 filed on Apr. 27, 2021 and of International Patent Application Number PCT/EP2021/066090 filed on Jun. 15, 2021. All of said applications are herein incorporated by reference in their entirety.

TECHNICAL FIELD

The disclosure relates to a method for determination of an operating state of a compressor and/or a rotational speed of a compressor drive of the compressor. The disclosure also relates to a device for carrying out a method according to the disclosure and, compressor measuring system and a computer-readable storage medium.

BACKGROUND

For the monitoring, analysis, diagnosis or control of compressors, many problems arise from the need for different parameters of the compressor, such as the temporal course of the operating state (standstill, idling, load run), the delivery volume flow and the electrical power consumption.

The information needed to determine these parameters can be supplied, for example, by the controller of the compressor via a communication interface such as Ethernet, Modbus or Profibus.

However, this is often not the case with known compressors, since, for example, compressors are used without a controller and/or without a corresponding communication interface. Also, the communication interface may work with a proprietary and/or encrypted protocol, which provides the corresponding data only for the manufacturer of the compressor.

It is known from the prior art to tap signals by installing measuring equipment in or on the compressor, on the basis of which the required parameters are derived.

For example, the detection of the signals "motor running" and "load" is known. For this purpose, the positions or the control commands for the mains contactor, i.e. the information as to whether the compressor drive is supplied with electrical energy, and the electric contactor for the control of the inlet valve, i.e. the information as to whether air is flowing unhindered into the compressor, i.e. whether air is being delivered, are tapped via potential-free contacts in a control cabinet of a compressor. From the detected position of the mains contactor and the electric contactor for controlling the inlet valve, the standstill, idling and load run operating states of the compressor can be distinguished in combination.

This prior art method of tapping the signals has several disadvantages. On the one hand, the electrical system in the control cabinet of the compressor is interfered with in order to connect the potential-free contacts. This intervention requires specially trained personnel, also referred to as electrically instructed personnel, since the connection of the signals takes place in the control cabinet of the compressor. Also, the installation for tapping the signals cannot take place while the compressor is running, as the potential-free contacts are connected to live parts. The compressor must therefore be disconnected from the electrical mains. Also, for compressors with variable-speed compressor drive, the rotational speed of the compressor drive cannot be determined via the signals "motor running" and "load".

It is also known from the prior art to use the reflex pulse counting method for determining the rotational speed. In reflex pulse counting, reflective markers are placed on the shaft between the compressor drive and the compressor. An optical sensor counts the number of pulses per time unit of the rotating shaft. The number of pulses per time unit is proportional to the rotational speed of the shaft. This means that the number of pulses can be used to infer the rotational speed of the shaft and thus the rotational speed of the compressor drive.

However, this type of speed determination has the disadvantage that the reflective markers can only be attached to the shaft when the machine is at a standstill. In addition, attaching the optical sensor requires time, as vibrations of the compressor during operation can cause the optical sensor to slip. Therefore, the optical sensor must be attached via a solid mechanical attachment. Another disadvantage is that although the rotational speed of the compressor drive can be determined by reflex pulse counting, it is not possible to distinguish between the operating states "standstill", "idling" and "load run". It is only possible to distinguish between "standstill" (speed 0 rpm) or "non-standstill" (speed greater than 0 rpm).

Another method known from the prior art is the active current measurement at the supply line of the compressor drive via a current clamp or a Rogowski coil. The basic idea of this type of signal detection is to determine the active current at one of the phases L1, L2 or L3 without electrical contact by measuring the magnetic field strength. For this purpose, the effect is used that the magnetic field strength around a current-carrying conductor is proportional to the current strength in the conductor. The position of the signal acquisition for a compressor with a fixed-speed drive and a compressor with a variable-speed drive are shown in FIGS. 1 and 2.

The signal acquisition in this method known from the prior art is carried out in such a way that the RMS value of the current intensity over one or more waves of the alternating current is calculated from the measured value of the current intensity (alternating current) tapped at the phase via the magnetic field strength. The RMS value of the current intensity of an alternating current represents the equivalent current intensity of a direct current. Based on the RMS value of the alternating current, the "standstill", "idling" and "load run" operating states can be distinguished by thresholding. The relationship between the magnetic field strength, the RMS value of the current and the operating state is shown by way of example in FIG. 3.

In the example of FIG. 3 as known from the prior art, a threshold value of 30 A was used for the derivation of the operating state for the detection of the "idling" operating state and a threshold value of 160 A for the detection of the "load run" operating state. These two values must be taken from the data sheet of the respective compressor or calculated based on values from the data sheet. Consequently, this prior-art method requires a very precise measurement of the RMS value of the current.

This method, known from the prior art, has the additional disadvantage that the control cabinet of the compressor must be opened for the installation of the current clamp or the Rogowski coil, since the current clamp or the Rogowski coil must be placed around a single phase. This is basically only possible in the control cabinet. This means that electrically trained personnel are required for the installation. It is also not possible to determine the rotational speed of the compressor drive by this method. This is because the current intensity depends not only on the rotational speed but also on the back pressure at the compressor outlet and the phase shift between current and voltage. For the same electrical power consumption, a different current may be required due to a different phase shift (expressed via the active power factor cos $\phi$).

The disclosure provides a method which eliminates or at least minimizes the disadvantages known from the prior art. In particular, the present disclosure provides a reliable, fast and inexpensive detection of the operating state of the compressor and/or the rotational speed of the compressor drive.

BRIEF SUMMARY

In particular, provided is a method for determination, in particular for contactless determination, of an operating state of a compressor and/or a rotational speed of a compressor drive, in particular of a variable-speed or fixed-speed compressor drive, comprising the following method steps:

- detecting a magnetic field over a time range by means of a detection element, wherein the magnetic field is generated by a current of at least one phase of a power supply cable or at least one phase of a motor lead;
- determining the frequency spectrum of the magnetic field over the time range;
- analyzing the frequency spectrum of the magnetic field to determine an operating state of the compressor and/or to determine a speed of the compressor drive.

In the context of the present disclosure, the term "contactless" is to be understood in particular as meaning that there is no electrical contact. A mechanical contact can certainly exist.

In the context of the present disclosure, the term "current" in particular describes an alternating current or three-phase current.

In the context of the present disclosure, the term "compressor" is particularly, but not exclusively, meant to include compressors and related machinery, such as blowers and the like. It is also common for a compressor to include, but not be limited to, a compressor block, wherein the compressor block is driven by a compressor drive, for example an electric motor, in particular an electric motor having one, two or more pairs of poles.

In the context of the present disclosure, the term "power supply cable" is particularly, but not exclusively, understood to mean a cable for supplying power to the compressor and/or a cable for supplying power to the compressor drive. It is also possible that the power supply cable supplies power to further electrical components of the compressor. Such further components could be, for example, fan motors, valves, a machine controller or the like.

In the context of the present disclosure, the term "motor lead" is understood as all conductors in the immediate area of the compressor drive which are provided or arranged for driving the compressor drive. In this regard, the motor lead may include conductors in the periphery of the compressor drive, on or in the compressor drive housing on or in the compressor drive itself, including current-carrying coils provided to drive the compressor drive or to assist in driving the compressor drive.

In particular, it is noted that in the context of the present disclosure, a neutral conductor, when energized, is considered to be a phase.

In the context of the present disclosure, the term "detecting a magnetic field" particularly, but not exclusively, describes detecting one or more magnetic characteristics. This magnetic characteristic may be an absolute value at a point in time or a plurality of absolute values in a time range. It is also possible that a temporal development of the magnetic characteristic is detected within a time range. Likewise, the term "detecting a magnetic field" may be understood to mean the ratio of absolute measured values to one another in a specific time range. In particular, according to an advantageous idea of the disclosure, the physical quantities of the magnetic field can also be detected without units and, optionally, further processed or indicated (also in the representation in the figure part of the application). What is relevant is the relation of the numerical values to each other. Therefore, a linear scaling of the axes is preferably also used in the representation.

One advantage of the method according to the disclosure is that, based on the analysis of the frequency spectrum of the magnetic field, the rotational speed of the compressor drive and/or the operating state of the compressor can be determined. A further advantage of the method according to the disclosure is that the exact value of the magnetic characteristic and/or the magnitude of the RMS value of the current is not required in order to determine the rotational speed of the compressor drive and/or the operating state of the compressor. In this respect, it is possible to work with recorded values for magnetic characteristics and/or magnitude of RMS value, since their relative change over time appears sufficient for the analysis according to the disclosure. Also, it is not so important at which exact position of the generated magnetic field these values are recorded, since also in this respect only their relative change over time is important.

Consequently, these parameters do not have to be determined with high constructive effort as is usual in the prior art. Rather, it is possible that, for example, a determination of an operating state of the compressor and/or a determination of a rotational speed of the compressor drive is carried out by comparing the magnetic characteristics recorded within a time range with one another. As a result of the method according to the disclosure, a simpler determination of the rotational speed of the compressor drive and/or a simplified determination of the operating state of the compressor is possible. Furthermore, the method according to the disclosure enables a determination of the rotational speed of the compressor drive and/or a determination of the operating state of the compressor without precise knowledge of the characteristic values of the compressor and/or the compressor drive. Consequently, the method according to the disclosure is also suitable for already installed compressors or compressor drives.

In one embodiment, detecting the magnetic field comprises detecting a magnetic field strength, in particular using a Rogowski coil, and/or detecting a magnetic flux density, in particular using a Hall sensor or a magnetoresistive sensor.

An advantage of this embodiment is that devices known from the prior art and, in the case of the Hall sensor, inexpensive devices can be combined with the method according to the disclosure. Likewise, it is possible that the direction of a magnetic vector and/or the magnitude of a magnetic vector is detected.

In a further embodiment, the method according to the disclosure comprises the following method step of attaching the detection element to a phase of the power supply cable or the motor lead.

An advantage of this embodiment is that the detection element can be variably attached to a phase of the power supply cable or the motor lead. For example, in the case of a compressor with a frequency converter, the detection element is attached between the frequency converter and the compressor drive, in particular when a speed is determined. In the case of a fixed-speed compressor, and similarly in the case of an operating state determination for a compressor with a frequency converter, the detection element may be placed anywhere in the power supply to the compressor drive. For example, the detection element may be placed in the compressor supply line or directly in front of the main drive motor or anywhere in between. It is also possible to provide the sensing element directly on or inside the main drive motor.

According to one embodiment, the method according to the disclosure comprises the following step of attaching the detection element to a plurality of phases, in particular all phases, of the power supply cable or motor lead in such a way as to measure the magnetic field generated by the current of the plurality of phases, in particular all phases, of the power supply cable or the motor lead.

An advantage of this embodiment is that the detection element can be variably attached to a plurality of phases, in particular all phases of the power supply cable or the motor lead. Consequently, the magnetic field generated by the current of the plurality of phases of the power supply cable or the motor lead is measured. It is sufficient for the method according to the disclosure that the detection element is attached to a plurality of phases. The need for mechanical separation of the individual phases of the power supply cable or the motor lead is eliminated, which in particular simplifies the attachment of the detection element, since this does not have to be attached to a specific phase.

In one embodiment, the analysis of the frequency spectrum comprises an analysis of the time course of the magnetic field.

An advantage of this embodiment is that the method according to the disclosure can be used variably.

Advantageously, the frequency components contained in the time course of the magnetic field are analyzed using a Fourier analysis and/or a wavelet analysis and/or a Görtzel algorithm.

An advantage of this embodiment is that the method according to the disclosure can be combined with mathematical methods known from the prior art. This is particularly advantageous in the light of a software-technical realization of the method according to the disclosure, since a reduction in the computational load and memory load can thereby be achieved. It has also been shown that the frequency resolution can be increased by using the Görtzel algorithm. Likewise, it has been shown that the Görtzel algorithm in particular can be efficiently implemented in digital signal processors.

In a further embodiment, the frequency of the magnetic field is determined by analyzing the individual frequency components, and the fundamental frequency of the current of the at least one phase of the power supply cable or the motor lead is determined based on the frequency of the magnetic field.

In the context of the present disclosure, the term "fundamental frequency" means in particular, but not exclusively, the fundamental frequency of the alternating or three-phase current, in particular the frequency greater than 0 Hz with the highest amplitude.

An advantage of this embodiment is that the magnetic field strength and the magnitude of the RMS value of the current do not have to be known exactly for the method according to the disclosure. It is solely a matter of finding out at what frequency the magnetic field oscillates. The frequency of the oscillation of the magnetic field is the same frequency at which the three-phase current of the compressor drive rotates.

In a further embodiment, the rotational speed of the compressor drive is determined from the determined fundamental frequency of the current, in particular by using a factor.

An advantage of this embodiment is that the rotational speed of the compressor drive can be reliably determined. For example, a compressor drive with one pole pair is assumed to have a factor of "1", while a compressor drive with two pole pairs is assumed to have a factor of "2". In general, this relationship can be represented as speed=frequency/number of pole pairs.

In a further embodiment, exactly one phase of the power supply cable or the motor lead is detected in the step of detecting.

An advantage of this embodiment is that methods known from the prior art can be used for mounting the detection element. This means that no new training of the personnel is necessary, which reduces the costs for an operator of a compressor.

According to a further embodiment, a plurality of phases, in particular all phases of the power supply cable or the motor lead are detected in the step of detecting.

An advantage of this embodiment is that the magnetic field, which is generated in total by several, in particular all phases of the power supply cable or the motor lead, is detected. The prior art assumes that no magnetic field can be detected in this case, since in theory the magnetic fields of the individual currents in the symmetrically loaded phases cancel each other out. However, it has been found that the phases are not symmetrically loaded, resulting in so-called leakage currents between the individual phases (and likewise a possibly present neutral conductor). These leakage currents also generate a magnetic field, the field strength of which can be detected. This magnetic field and in particular the magnetic characteristics are orders of magnitude lower than the magnetic field and the magnetic characteristics when measuring a single phase. However, the magnetic field and also the magnetic characteristics and in particular their qualitative temporal course can be reliably detected. This makes it possible for the magnetic field to be detected at points on the power supply cable or the motor lead for which electrically trained personnel are not required. An example of such a location is the interior of the machine at the compressor drive supply cable before the compressor drive terminal box. In the case of a compressor with a fixed-speed compressor drive, the detecting of the magnetic field may even take place outside the compressor in an electrical supply line. It is also possible that not only the phases of the power supply cable of the compressor or the compressor drive are detected, but also a possibly present neutral conductor of the power supply cable. Furthermore, it is also possible to measure the magnetic field directly at or inside the compressor drive.

In a further advantageous embodiment, a phase spectrum of the magnetic field, in particular in a defined time range, is evaluated to determine the operating state and/or the rotational speed.

An advantage of this embodiment is that the determination of the operating state and/or the rotational speed is improved. This is due to the fact that the phase spectra in the different operating states and/or the different rotational speeds differ significantly from each other.

In a further embodiment, an amplitude spectrum of the magnetic field, in particular in a defined time range, is evaluated to determine the operating state and/or the rotational speed.

An advantage of this embodiment is that the determination of the operating state and/or the rotational speed is improved. This is due to the fact that the amplitude spectra in the different operating states and/or the different rotational speeds differ significantly from each other.

In one embodiment, the time range is 200 ms to 20 s, preferably 300 ms to 10 s, more preferably 500 ms to 5 s, particularly 750 ms to 3 s, especially 1 s.

An advantage of this embodiment is that the time range can be selected according to the requirements of the compressor and the realization of the method according to the disclosure.

In a further embodiment, the phase spectrum of the magnetic field is automatically evaluated, in particular by forming the variance of the phase spectrum in a frequency range from 0 Hz to 10 kHz, preferably 0 Hz to 1 kHz, particularly preferably in a range around an excitation frequency.

An advantage of this embodiment is that, depending on the compressor drive, the frequency range in which the phase spectrum is evaluated can be adjusted accordingly. In this respect, it has been shown that a frequency range of 0 Hz to 10 KHz is suitable for a high-speed compressor drive, a frequency range of 0 to 1 kHz is suitable for a non-high-speed compressor drive, and a frequency range around the excitation frequency, in particular around 50 Hz or 60 Hz with a variance of ±5 Hz, is suitable for a fixed-speed compressor drive.

In a further embodiment, the amplitude spectrum of the magnetic field is automatically evaluated, in particular by forming the variance of the amplitude spectrum in a frequency range from 0 Hz to 10 kHz, preferably 0 Hz to 1 kHz, particularly preferably in a range around an excitation frequency.

An advantage of this embodiment is that, depending on the compressor drive, the frequency range in which the amplitude spectrum can be evaluated can be adjusted accordingly. In this respect, it has been shown that a frequency range of 0 Hz to 10 kHz is suitable for a high-speed compressor drive, a frequency range of 0 to 1 kHz is suitable for a non-high-speed compressor drive, and a frequency range around the excitation frequency, in particular around 50 Hz or 60 Hz with a variance of ±5 Hz, is suitable for a fixed-speed compressor drive.

In a further embodiment, the frequency range is a multiple, in particular a multiple of 2 to 10 times the excitation frequency.

An advantage of this embodiment is that the frequency range can be selected accordingly depending on the hardware or software available for scanning.

According to a further embodiment, the operating state of the compressor is determined based on the frequency spectrum of the magnetic field using a clustering method and/or a classification method.

An advantage of this embodiment is that it allows automatic determination of the operating state of the compressor.

In a further embodiment, the clustering method and/or the classification method uses thresholds or a statistical method, in particular k-means and/or neural networks. In general, the determination of the operating state in the sense of the present disclosure can also be carried out with the support of artificial intelligence or machine learning.

An advantage of the cluster method and the classification method is that for both the cluster method and the classification method widely automated procedures can be used. This means in particular an improvement of the determination of the operating state of the compressor.

In a further embodiment, the classification method comprises three classifications, in particular the classifications standstill, idling and load run.

An advantage of this embodiment is that it provides a concrete realization of the classification method.

Another embodiment describes that each classification is defined based on the level of a statistical parameter.

An advantage of this embodiment is that the statistical parameter, for example the variance, the average, the modal value and the like, can be calculated quickly and reliably, in particular in a software implementation of the method according to the disclosure.

In a further embodiment, the operating state of the compressor and/or the rotational speed of the compressor drive is determined by analyzing the amplitude spectrum of the magnetic field in the frequency range of an excitation frequency.

An advantage of this embodiment is that an alternative determination method for the operating state of the compressor and/or the rotational speed of the compressor drive is provided.

According to a further embodiment, thresholding is performed during the analysis of the amplitude spectrum.

An advantage of this embodiment is that automated detection of the operating state can be performed hereby.

The disclosure further provides a device for performing a method according to any of the preceding embodiments, wherein the device comprises:

- a detection element for attachment to at least one phase of a power supply cable or a motor lead, wherein the detection element comprises
- a Rogowski coil, a current clamp, a MEMS magnetometer, and/or a Hall sensor or a magnetoresistive sensor.

By means of the device according to the disclosure, the advantages of the method are obtained. In particular, an advantage of the device according to the disclosure is that, on the basis of the analysis of the frequency spectrum of the magnetic field, it is possible to determine the rotational speed of the compressor drive and/or the operating state of the compressor. Another advantage of the device according to the disclosure is that the exact value of the magnetic characteristic and/or the magnitude of the RMS value of the current are not required in order to determine the rotational speed of the compressor drive and/or the operating state of the compressor. Consequently, these parameters do not have to be determined at high design cost as is common in the prior art. Rather, it is possible that, for example, a determination of an operating state of the compressor and/or a determination of a rotational speed of the compressor drive is carried out by comparing the magnetic characteristics detected within a time range with one another. By means of the device according to the disclosure, a simpler speed determination of the compressor drive and/or a simplified determination of the operating state of the compressor is possible. Furthermore, the device according to the disclosure enables a determination of the rotational speed of the compressor drive and/or a determination of the operating state of the compressor without precise knowledge of the characteristic values of the compressor or of the compressor drive. Consequently, the device according to the disclosure is also suitable for already installed compressors or compressor drives.

In a further embodiment, the detection element comprises at least one sensor unit, wherein the sensor unit comprises at least two of the following sensors: a sensor for detecting a magnetic field strength in an X-direction, a sensor for detecting a magnetic field strength in a Y-direction, or a sensor for detecting a magnetic field strength in a Z-direction.

An advantage of this embodiment is that the at least two sensors enable the magnetic field to be detected independently of the position of the respective sensor unit.

The disclosure provides using a device according to the preceding embodiments for determining a rotational speed of a compressor drive and/or for determining an operating state of a compressor.

By using the device according to the disclosure, the advantages of the device are obtained.

The disclosure further provides a computer-readable medium, comprising instructions which, when executed on one or more computing units, implement a method according to one of the preceding embodiments.

The computer-readable medium according to the disclosure, including computer-executable instructions, provides improved information handling of the method according to the disclosure.

According to an aspect of the disclosure is provided a method for determination of an operating state of a compressor and/or a rotational speed of a compressor drive of the compressor having the following method steps:

- measuring, over a time range, a magnetic field associated with one or more phases of an electrical power supply conductor supplying the compressor with electrical power,
- wherein the magnetic field is measured by a detection element to provide a representation of the magnetic field,
- determining a frequency spectrum of the representation of the magnetic field over the time range;
- analyzing the frequency spectrum of the representation of the magnetic field over the time range to determine an operating state of the compressor and/or to determine a rotational speed of the compressor drive.

The analyzing the frequency spectrum may preferably be carried out by a spectrum analyzer. The spectrum analyzer may be integrated into a compressor measuring system, e.g. as stand alone or integrated in the computer-driven compressor measuring system.

The compressor drive may be a variable-speed or fixed-speed compressor drive.

In the present context a compressor is understood as the total assembly of air end and electrical motor. The air end is the part of the compressor where the actual compression takes place and the electrical motor includes/forms part of the compressor drive.

The magnetic field measured according to the provisions of the disclosure is generated by a current of at least one phase of a power supply cable supplying the compressor with electrical power. The magnetic field associated therewith may e.g. be measured at the electrical power supply conductor, but it may also be measured e.g. at a housing of the compressor or other locations related to the compressor as long as the measured magnetic field reflects and can be associated with the operational state of the compressor or at least the rotational speed of the compressor drive.

In the present context, a representation of a magnetic field designates a plurality of values related to the magnetic field of compressor, preferably as a function of time. This may include the possibility of measuring the evolution of the magnetic field in question over time and thereby derive relevant information therefrom. A representation of a magnetic field may e.g., be derived from magnetic flux (density) or derived (e.g., a differential) as from an inductive measurement of an alternating field.

It should be noted that the magnetic field measured should be measured at a location where the desired information can in fact be derived. An example of a consideration related to such measuring is if the compressor drive is a variable speed drive which is supplied and controlled by e.g., a frequency converter. The skilled person will appreciate that relevant information might be difficult to obtain by measuring of non-modulated power signals at the input end of a frequency converter and that the right place to measure is at the output of the converter or at the “downstream” of the converter, such as at the power supply cable or even more “downstream” at the housing of the compressor.

The determining of the frequency spectrum may preferably be based on automatic calculations performed in a computer processor arrangement.

The measuring of the magnetic field may e.g., be done by measuring inductively e.g., by a Rogowski coil, (measuring based on changes in magnetic field) or e.g., be done by the application of a Hall effect sensor (detecting magnetic flux density). The aforementioned inductive sensor(s) or Hall effect sensor(s) may also be referred to as a detection element throughout the application.

It should of course be noted that the above-mentioned measuring has to be performed in relation to the electrical power supply of the compressor, typically a cable with one or more phases, by means of in itself known methods related to the applied detection element(s), but now used in the inventive and new application. Measurements of magnetic field in the present context are typically converted into digital samples stored in computer memory configured for access for algorithms using the samples for further processing, such as frequency analysis, etc.

According to an embodiment of the disclosure measuring of the magnetic field comprises inductively measuring changes in magnetic field strength e.g., by using a Rogowski coil or by the measuring of magnetic flux density, e.g., using a Hall sensor.

According to an embodiment of the disclosure the method comprises the following method step:

- positioning the detection element relative to a phase of the power supply cable to measure the magnetic field generated by the current of the phase.

According to an embodiment of the disclosure the method comprises the following method step:

- positioning the detection element relative to a plurality of phases of the power supply cable in such a way as to measure the magnetic field generated by the current of the plurality of phases.

The positioning of the detection element relative to a plurality of phases may advantageously refer to a positioning of the detection element relative to all phases of the power supply cable.

According to an embodiment of the disclosure the determination of the frequency spectrum comprises an analysis of temporal development of the magnetic field.

Elsewhere in the application temporal development may also be referred to a time course related to a certain signal.

According to an embodiment of the disclosure the temporal development of the magnetic field is analyzed using a Fourier analysis and/or a wavelet analysis and/or a Görtzel algorithm.

According to an embodiment of the disclosure analyzing the individual frequency components, a frequency of the magnetic field is determined, and wherein a fundamental frequency of the current of the at least one phase of the power supply cable is determined based on the frequency of the magnetic field.

In an embodiment of the disclosure a fundamental frequency of current of the at least one phase of the power supply cable is determined on the basis of an analysis of the determined frequency spectrum.

In an embodiment of the disclosure the rotational speed of the compressor drive is determined on the basis of an analysis of the determined frequency spectrum, e.g., by determining peak(s) at certain frequencies of the determined frequency spectrum.

The determined peaks may e.g., be subject to further computing in order to translate the spectrum into a real-life determination of the rotational speed of the compressor drive.

According to an embodiment of the disclosure the rotational speed of the compressor drive is determined from the determined fundamental frequency of the current, e.g., by using a factor depending on the number of pole pairs of the compressor drive.

In an embodiment of the disclosure exactly one phase of the power supply cable is subject to measuring of the magnetic field.

In an embodiment of the disclosure, a plurality of phases, preferably all phases, of the power supply cable is subject to measuring of the magnetic field.

According to an embodiment of the disclosure a phase spectrum of the magnetic field, in particular in a defined time range, is evaluated in order to determine the operating state of the compressor and/or the rotational speed of the compressor drive of the compressor.

According to an embodiment of the disclosure an amplitude spectrum of the magnetic field, in particular in a defined time range, is evaluated in order to determine the operating state of the compressor and/or the rotational speed of the compressor drive of the compressor.

According to an embodiment of the disclosure the time range is 200 ms to 20 s.

In an embodiment of the disclosure, the time range is 200 ms (200 milliseconds) to 20 s (20 seconds), such as 300 ms to 10 s, such as 500 ms to 5 s, such as 750 ms to 3 s, such as 1 s.

According to an embodiment of the disclosure a phase spectrum of the magnetic field is automatically evaluated, in particular by forming the variance of the phase spectrum in a frequency range from 0 Hz to 10 kHz, preferably 0 Hz to 1 kHz, particularly preferably in a range around an excitation frequency, where the excitation frequency is the nominal frequency of the oscillations of alternating current (AC) of the mains supplying the electrical power to the compressor drive.

According to an embodiment of the disclosure an amplitude spectrum of the magnetic field is automatically evaluated, in particular by establishing the variance of the amplitude spectrum in a frequency range from 0 Hz to 10 kHz, preferably 0 Hz to 1 kHz, particularly preferably in a range around an excitation frequency, where the excitation frequency is the nominal frequency of the oscillations of alternating current (AC) of the mains supplying the electrical power to the compressor drive.

According to an embodiment of the disclosure the frequency range is a multiple, in particular a 2-fold to 10-fold multiple, of the excitation frequency.

In an embodiment of the disclosure, the operating state of the compressor is determined based on the frequency spectrum using artificial intelligence, such as machine learning.

In an embodiment of the disclosure, the operating state of the compressor is determined based on the frequency spectrum using supervised learning, for example classification, neural networks, support vector machine, decision trees, and Bayesian statistics. The supervised learning algorithms may be trained using training data comprising already detected frequency spectrums, corresponding to respective predefined operating states.

In an embodiment of the disclosure, the operating state of the compressor is determined based on the frequency spectrum using unsupervised learning, for example k-means clustering, hierarchical clustering, neural networks, and hidden Markow model.

In an embodiment of the disclosure, the operating state of the compressor is determined based on the frequency spectrum using reinforcement learning.

According to an embodiment of the disclosure the operating state of the compressor is determined based on the frequency spectrum of the magnetic field using a clustering method and/or a classification method.

According to an embodiment of the disclosure the clustering method and/or the classification method uses threshold values or a statistical method, in particular k-means and/or neural networks.

According to an embodiment of the disclosure the classification method comprises three classifications representing different operational states of the compressor.

According to an embodiment of the disclosure the classification method comprises classifications representing different operational states of the compressor, the classifications including standstill, idling and load run.

According to an embodiment of the disclosure the operating state of the compressor and/or the rotational speed of the compressor drive is determined by an analysis of the amplitude spectrum of the magnetic field in the frequency range of an excitation frequency where the excitation frequency is the nominal frequency of the oscillations of alternating current (AC) of the mains supplying the electrical power to the compressor drive.

According to an embodiment of the disclosure the analyzing includes a thresholding of the amplitude spectrum.

An aspect of the disclosure relates to a device for carrying out a method according to any of the above disclosure, wherein the device comprises:

- a detection element for positioning relative to at least one phase of a power supply cable, wherein the detection element comprises a Rogowski coil, a current clamp, a MEMS magnetometer, and/or a Hall sensor.

In an embodiment of the disclosure the device comprises:

- a detection element for positioning relative to at least one phase of a power supply cable, wherein the detection element comprises a Rogowski coil, a current clamp, a MEMS magnetometer, and/or a Hall sensor and where the detection element is positioned to obtain measurement of magnetic field related to said at least one phase of the power supply cable.

According to an embodiment of the disclosure the detection element comprises at least one sensor unit, wherein the sensor unit comprises at least two of the following sensors:

a sensor for detecting a magnetic field strength in an X-direction, a sensor for detecting a magnetic field strength in a Y-direction, or a sensor for detecting a magnetic field strength in a Z-direction.

According to an embodiment of the disclosure the detection element comprises at least two sensors arranged for orthogonal measuring of magnetic field strength.

An aspect of the disclosure relates to a compressor measuring system comprising a detection element including at least one sensor for detecting a magnetic field of a compressor electrical power supply cable, the detection element outputting representations of the magnetic field detected by said detection element, a spectrum analyzer including at least one processor, the spectrum analyzer being communicatively coupled to said detection element and being configured for automatically analyzing the frequency spectrum of the representations of the magnetic field over a time range to determine an operating state of the compressor and/or to determine a rotational speed of the compressor drive, a user interface, such as a graphical user interface, for automatically communicating said operating state and/or said rotational speed of the compressor drive to said user interface.

According to an embodiment of the disclosure the compressor measuring system may be operated according to the method of any of the above disclosure.

An aspect of the disclosure relates to a computer-readable storage medium containing instructions that cause at least one processor to implement a method according to any of the above disclosure when the instructions are executed by the at least one processor.

BRIEF DESCRIPTION OF THE DRAWINGS

The disclosure will be described below by means of several exemplary embodiments which will be explained in more detail with reference to figures, wherein.

DETAILED DESCRIPTION

Figure 7:
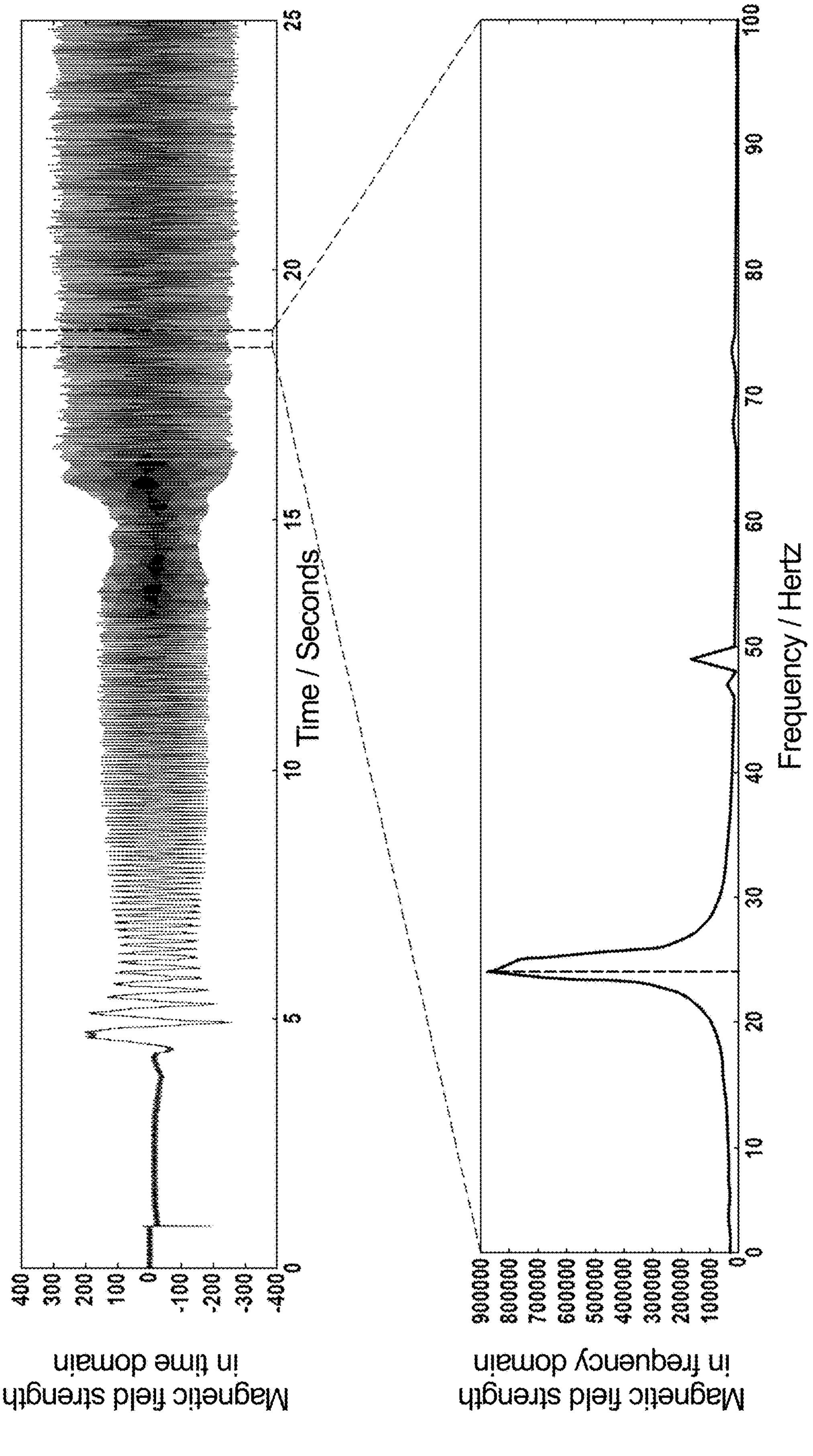
FIG. 7 shows an evaluation of a time section of the magnetic field strength in the frequency range (amplitude spectrum) according to the disclosure.

In particular, it is noted that the present disclosure is based on detecting the magnetic field of phases L1, L2, L3 induced by the current in an electrical power supply conductor including e.g., a power supply cable and a motor lead. However, for the determination of the rotational speed of the compressor drive, the evaluation of the magnetic field strength as an indicator of the current intensity or the RMS value of the current is omitted. Instead, the method according to the disclosure analyzes the time characteristic of the magnetic field strength with respect to the frequency components contained therein by analyzing the frequency range, for example using Fourier analysis, wavelet analysis, or the Görtzel algorithm. By analyzing the individual frequency components, the frequency of the magnetic field is recognized which is attributable to the fundamental frequency of the three-phase current at which the compressor drive is driven. An example of such a frequency analysis for a time section of the magnetic field strength signal is shown in FIG. 7.

In the following description, the same reference numerals are used for identical and similarly acting parts.

Figure 1:
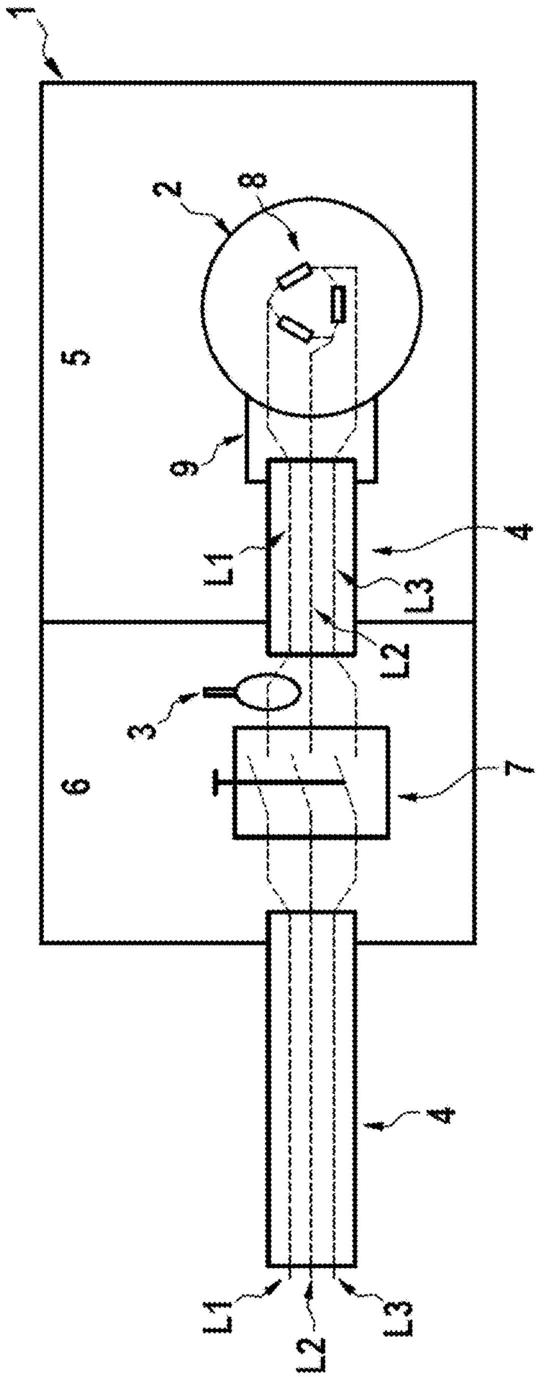
FIG. 1 shows a known prior-art detection of the current intensity at a compressor with a fixed-speed compressor drive.

FIG. 1 shows a known prior art for detecting the current intensity at a compressor 1, for example a compressor with a fixed-speed compressor drive 2. The compressor 1 has a compressor drive 2, wherein this is for example an electric motor and has a corresponding motor winding 8. A terminal box 9 is arranged in front of the compressor drive. Both the compressor drive 2, and a part of the power supply cable 4 and the terminal box 9, are accommodated in a machine interior 5. A detection element 3 is attached to one of the phases of the power supply cable 4 after the mains contactor 7, i.e. in the area of the control cabinet 6. As can be seen from FIG. 1, part of the power supply cable 4 extends between the machine interior 5 and the control cabinet 6. FIG. 1 shows an attachment of the detection element 3 to phase L1.

Figure 2:
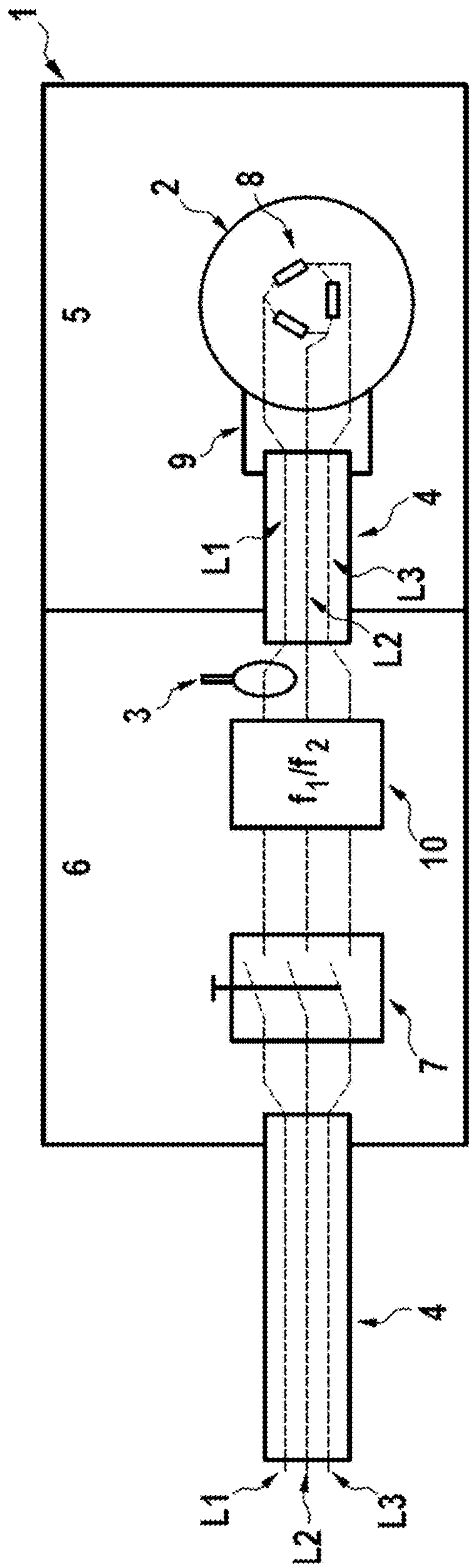
FIG. 2 shows a known prior-art detection of the current intensity at a compressor with a fixed-speed compressor drive.

FIG. 2 schematically shows a detection of the current intensity, as known from the prior art, at a compressor 1, for example a compressor, with variable-speed compressor drive 2. The detection of the current intensity at the compressor 1 with variable-speed compressor drive 2 differs from the detection of the current intensity at a compressor 1 with fixed-speed compressor drive 2 in that the detection element 3 is attached to one of the phases of the power supply cable 4 after a frequency converter 10. In this respect, the frequency converter 10 is a separate component from the compressor drive 2.

The active current measurement is carried out on the power supply cable 4 of the compressor drive 2 via a detection element 3, for example a current clamp or a Rogowski coil. At one phase of the power supply cable 4, in FIGS. 1 and 2 at phase L1, the active current is determined without contact by measuring the magnetic field strength. For this purpose, the effect that the magnetic field strength around the phase L1 is proportional to the current strength in the phase L1 is used. The possible positioning of the detection element 3 for a compressor with a fixed-speed compressor drive is shown in FIG. 1, while the possible positioning for a compressor with a variable-speed compressor drive is shown in FIG. 2.

Figure 3:
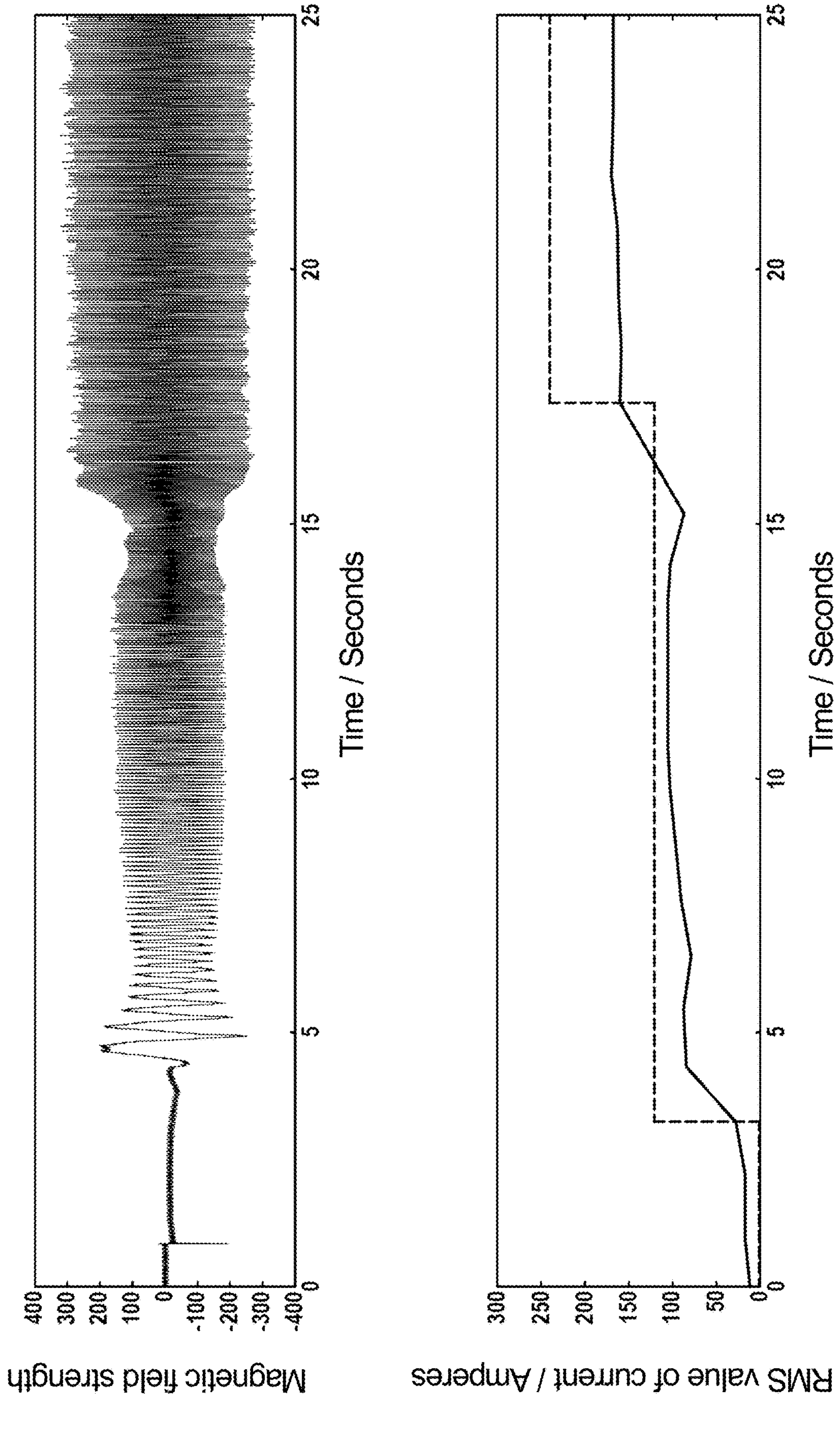
FIG. 3 shows a relationship known from the prior art between the magnetic field strength, the RMS value of the current and the operating state.

FIG. 3 shows the relationship between the magnetic field strength, the RMS value of the current and the operating state as known from the prior art. The upper diagram in FIG. 3 shows the magnetic field strength over time (in seconds).

The lower diagram in FIG. 3 shows the RMS value of the current and the operating state that can be derived from it. The signal acquisition in this method known from the prior art is carried out in such a way that the RMS value of the current intensity over one or more waves of the alternating current is calculated from the measured value of the current intensity (alternating current) tapped at the phase via the magnetic field strength. The RMS value of the current intensity of an alternating current represents the equivalent current intensity of a direct current. Based on the RMS value of the alternating current, the “standstill”, “idling” and “load run” operating states can be distinguished by thresholding. The relationship between the magnetic field strength, the RMS value of the current and the operating state is shown by way of example in FIG. 3.

In the example of FIG. 3 as known from the prior art, a threshold value of 30 A was used for the derivation of the operating state for the detection of the “idling” operating state and a threshold value of 160 A for the detection of the “load run” operating state. These two values must be taken from the data sheet of the respective compressor or calculated based on values from the data sheet.

Figure 4:
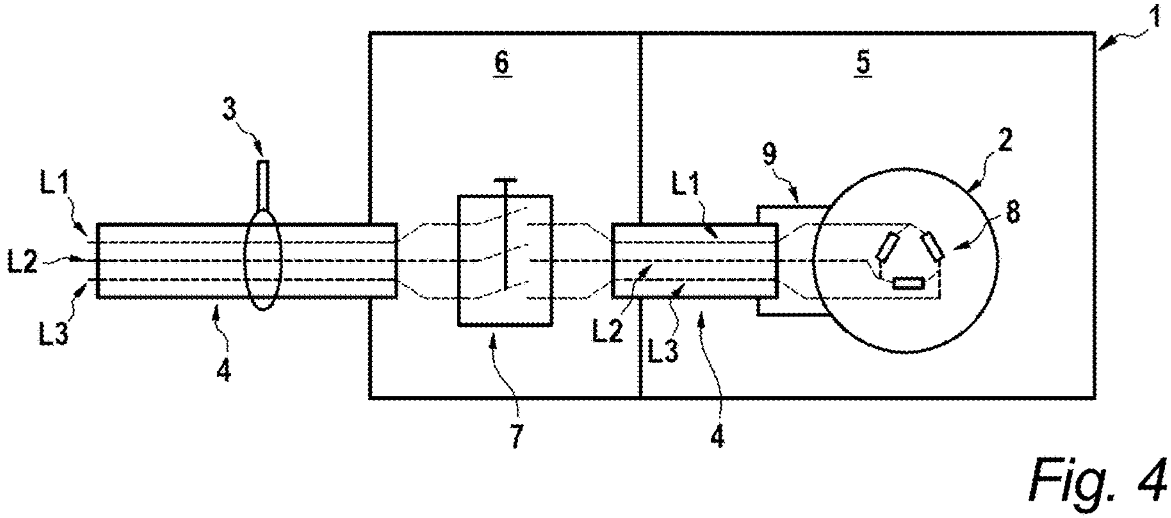
FIG. 4 shows a detection of the magnetic field in a compressor with a fixed-speed compressor drive according to a method according to the disclosure.

FIG. 4 shows a detection of the magnetic field in a compressor 1 with a fixed-speed compressor drive 2 according to a method according to the disclosure. Here, an embodiment of the method according to the disclosure is illustrated in which the detection element 3 detects all phases L1, L2 and L3 of the power supply cable 4. However, it will be understood by the person skilled in the art that the detection element 3 can be arranged in such a way that only one phase is detected, for example phase L1, or phase L2, or phase L3, or a current-carrying neutral conductor which is not illustrated. However, the position of the detection element 3 is fundamentally different from the positioning of FIG. 1. Thus, in the embodiment of FIG. 4, the detection element 3 is positioned/mounted outside the control cabinet 6 and outside the machine interior 5. This has the advantage that the detection element 3 can also be fitted by personnel who have not received electrical training.

Figure 5:
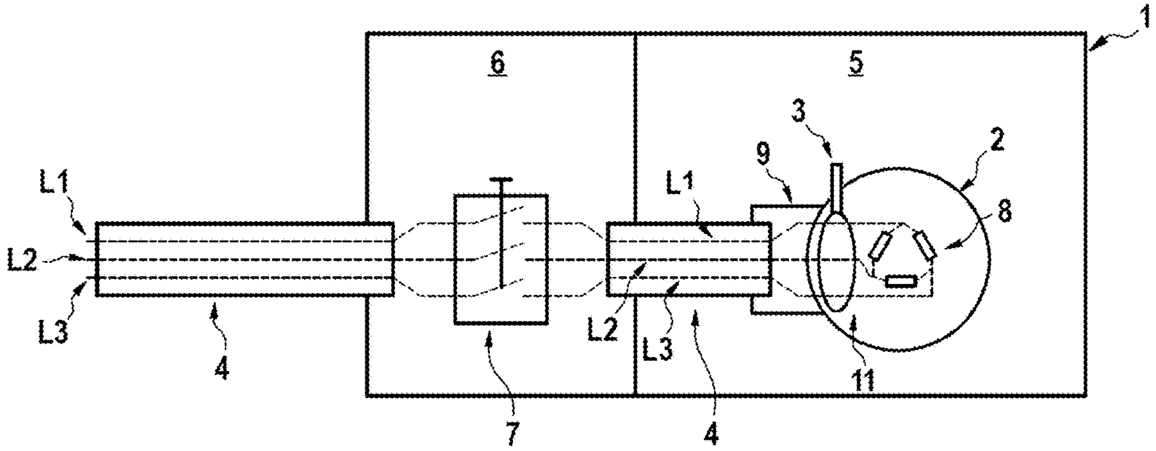
FIG. 5 shows a detection of the magnetic field in a compressor with a compressor drive in accordance with another method according to the disclosure.

FIG. 5 shows a detection of the magnetic field in a compressor 1 with a fixed-speed compressor drive 2 according to a method according to the disclosure. Unless otherwise described the compressor 1 of FIG. 5 has the same elements and/or components as the compressor 1 of FIG. 4. It should be noted that the compressor drive 2, in particular the motor winding 8 of the compressor drive 2, can be supplied with power via a motor lead 11. An embodiment of the method according to the disclosure is shown here, in which the detection element 3 detects all phases L1, L2 and L3 of the motor lead 11. However, it is understandable to the skilled person that the detection element 3 can be positioned/mounted in such a way that only one phase is detected, for example the phase L1, or the phase L2, or the phase L3, or a current-carrying neutral conductor which is not shown.

Figure 6:
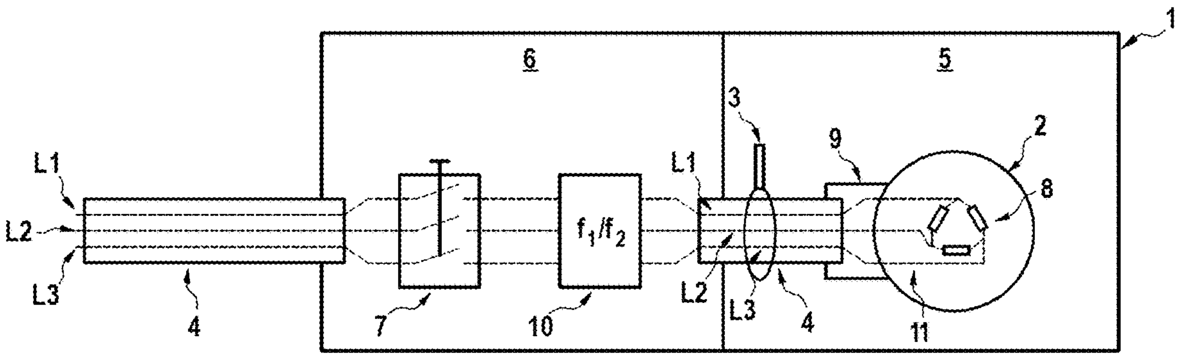
FIG. 6 shows a detection of the magnetic field in a compressor with a variable-speed compressor drive according to a method according to the disclosure.

FIG. 6 shows a detection of the magnetic field in a compressor 1 with variable-speed compressor drive 2 according to a method according to the disclosure. Again, an embodiment of the method according to the disclosure is illustrated in which the detection element 3 detects all phases L1, L2, L3 and a neutral conductor, if any, of the power supply cable 4, which is not illustrated in FIG. 5. However, it will be understood by the person skilled in the art that the detection element 3 can be arranged in such a way that only one phase, for example phase L1, or phase L2, or phase L3, or an optionally present neutral conductor, not shown in FIG. 5, is detected.

The prior art assumes that no magnetic field can be detected in the embodiment shown in FIGS. 4, 5 and 6, since in theory the magnetic fields of the individual currents in the symmetrically loaded phases L1, L2, L3 cancel each other out. However, the applicant has found that the phases L1, L2, L3 are not symmetrically loaded, resulting in so-called leakage currents between the individual phases L1, L2, L3 and/or the neutral conductor (not shown in FIGS. 4, 5 and 6). These leakage currents also generate a magnetic field, the magnetic field strength of which can be detected. This magnetic field and in particular the magnetic field strength are orders of magnitude lower than the magnetic field and magnetic field strength when measuring a single phase L1, L2, L3. The magnetic field and likewise the magnetic field strength and in particular their qualitative temporal course can be reliably detected. It is thus possible that the detection element 3 is placed at positions of the power supply cable 4 for which no electrically instructed personnel is required. An example of such a position is the machine interior 5 at the supply line of the compressor drive 2 in front of the terminal box 9 of the compressor drive 2, as shown for example in FIG. 6. In the case of a compressor 1 with a fixed-speed compressor drive 2, the detection element 3 can even be placed outside the compressor 1 in an electrical supply line, shown in FIG. 4 by the power supply cable 4.

FIG. 7 shows an evaluation of a time section of the magnetic field strength in the frequency range, the so-called amplitude spectrum, according to the disclosure. By analyzing the individual frequency components, the frequency of the magnetic field is identified which is attributable to the fundamental frequency of the three-phase current with which the compressor drive is driven.

The result of the determination of the magnetic field strength is shown in FIG. 7 above. FIG. 7 below shows an example of a frequency analysis for a time section of the magnetic field strength signal. The time section is indicated by dashed bars in FIG. 7 above.

In FIG. 7 below, i.e. in the amplitude spectrum, there is a clearly pronounced maximum at a frequency of 23.1 Hz. This frequency is exactly the frequency of the three-phase current which supplies the compressor drive 2 with electrical energy via the power supply cable 4. FIG. 7 shows an example of the magnetic field strength and amplitude spectrum for a compressor 1 with variable-speed compressor drive 2. The strength of the magnetic field and/or the magnitude of the RMS value of the current do not play any role for the method according to the disclosure. Rather, the method according to the disclosure determines the frequency at which the magnetic field oscillates. This frequency of oscillation of the magnetic field is thereby the same frequency at which the three-phase current of the compressor drive 2 rotates.

Figure 8A:
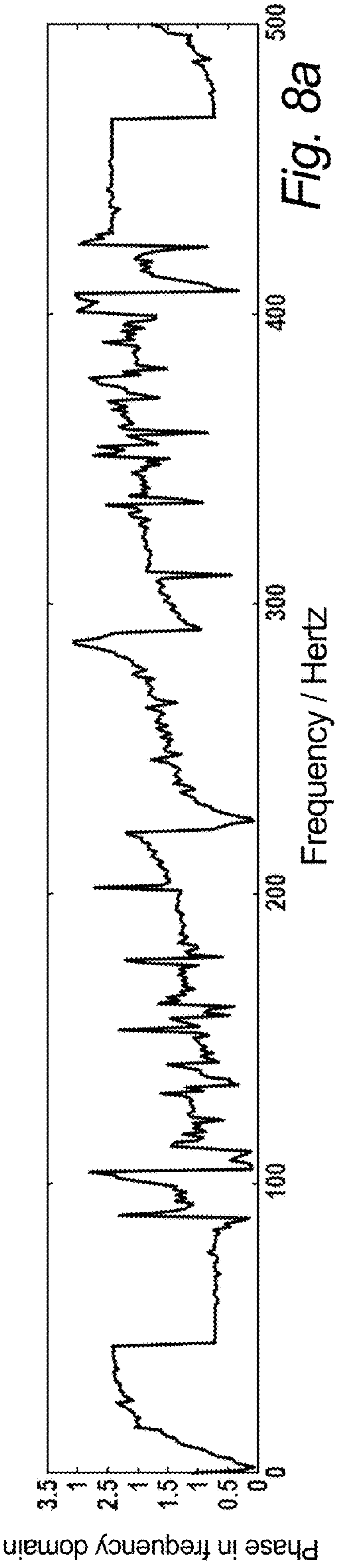
FIG. 8 shows an example of a phase spectrum of a compressor with a fixed-speed compressor drive during load run (FIG. 8*a*), idling (FIG. 8*b*) and standstill (FIG. 8*c*)
Figure 8B:
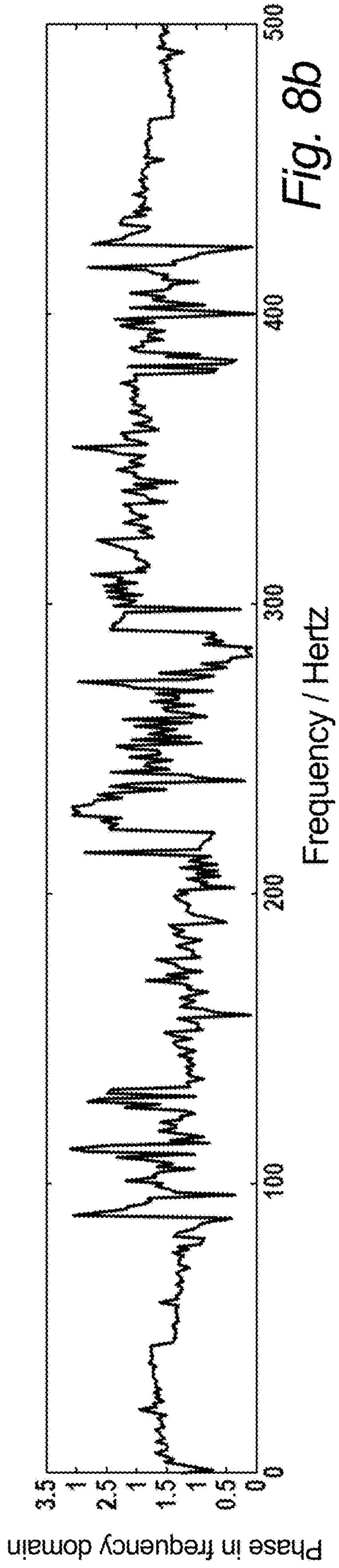
Figure 8C:
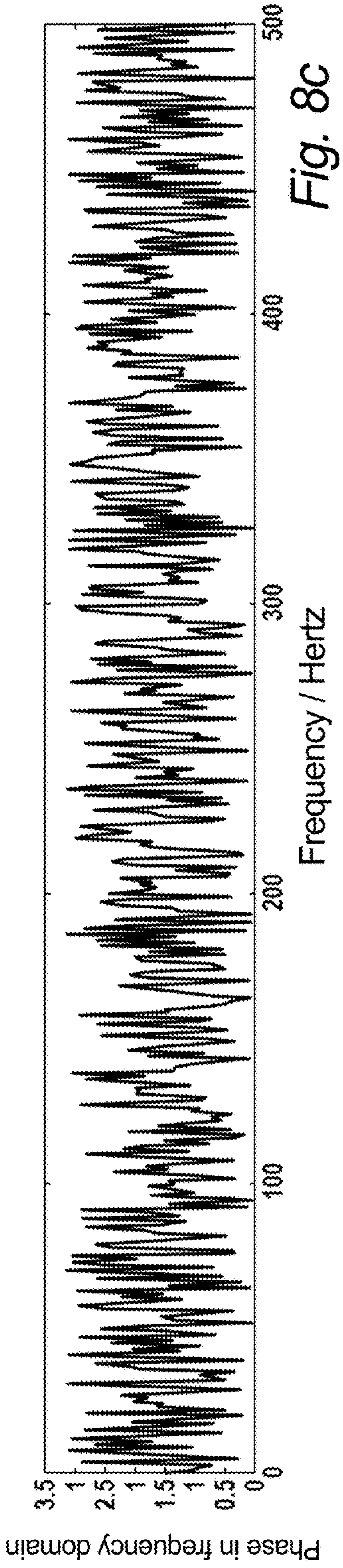

FIG. 8 shows an example of a phase spectrum of a compressor 1 with a fixed-speed compressor drive 2 in the "standstill", "idling" and "load run" operating states. FIG. 8*a* shows the "load run" operating state of compressor 1 with a fixed-speed compressor drive 2. FIG. 8*b* shows the "idling" operating state of compressor 1 with fixed-speed compressor drive 2. Finally, FIG. 8*c* shows the "standstill" operating state of compressor 1 with a fixed-speed compressor drive 2.

It can be seen from FIG. 8 that the phase spectra differ significantly in the individual operating states. It is also possible that for the detection of the operating state the phase spectrum of the magnetic field is evaluated in a defined time range, for example in a time range from 200 ms to 20 s, preferably 300 ms to 10 s, particularly preferably 500 ms to 5 s, especially 750 ms to 3 s, in particular 1 s (not shown in FIG. 8).

An automatic evaluation of the phase spectrum is performed, for example, by forming the variance of the phase spectrum in the range from 0 Hz to 80 Hz (not shown in FIG. 7). This variance is fed to a clustering algorithm. The clustering algorithm defines clusters using thresholds or using statistical techniques such as k-means or neural networks. Based on this clustering, a classification method is carried out, wherein each cluster is assigned an operational state based on the amount of variance. For example, the "standstill" operating state is assigned a very high variance, the "load run" operating state is assigned a medium variance and the "idling" operating state is assigned a very low variance. It is also possible that the classification method is performed without prior clustering.

From the spectrum of FIG. 8 it is visually apparent that the spectrum range from 240 Hz to 260 Hz is also suitable for clustering and thus for detecting the operating state. In the example shown in FIG. 8, the range from 240 Hz to 260 Hz corresponds to the frequency range of the chamber frequency of a block with 5 compression chambers. Consequently, it is also possible to use the analysis of the magnetic field to analyze the repercussions of the compression process on the power grid.

Figure 9:
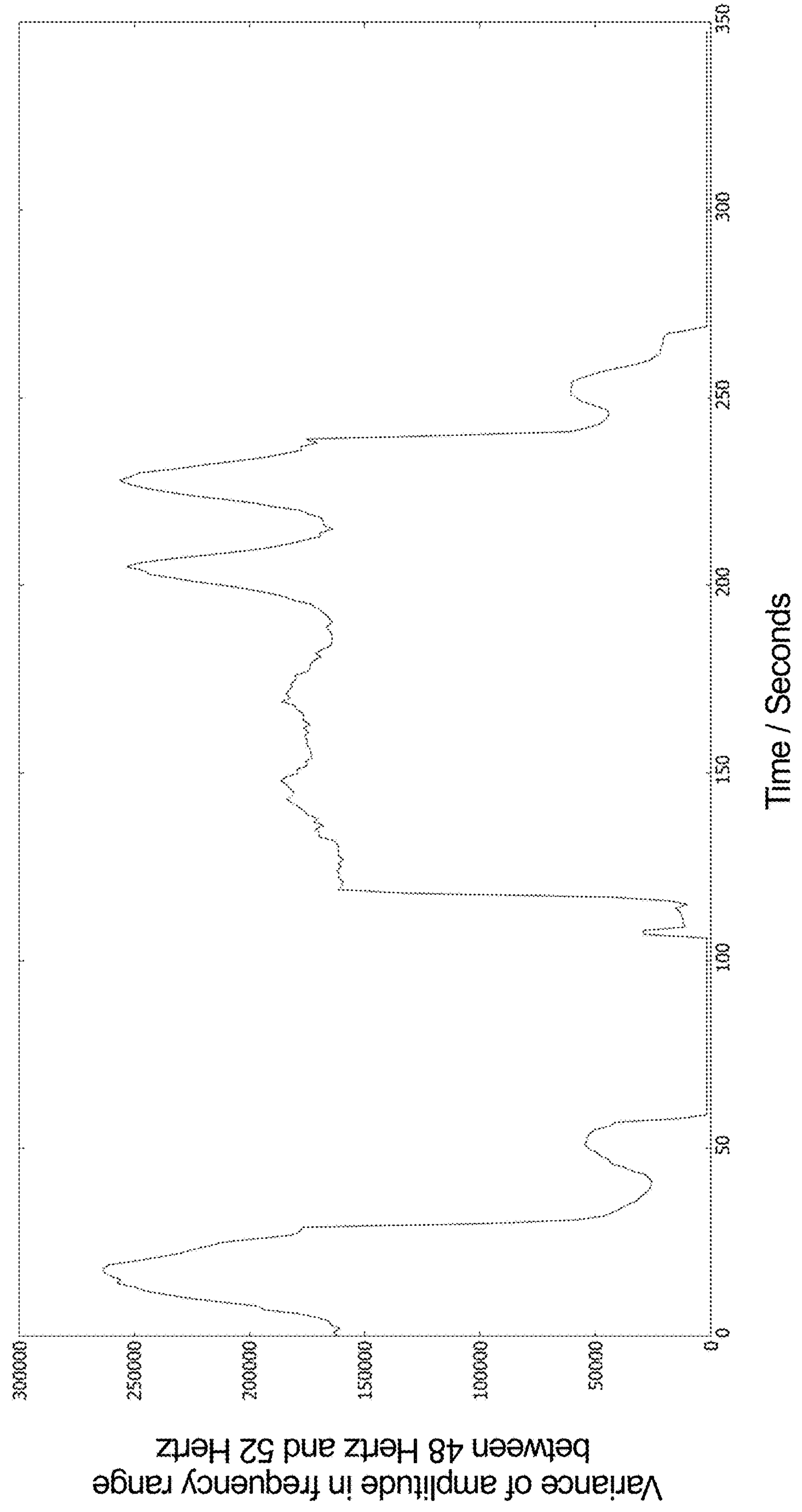
FIG. 9 shows the detection of the operating state from the variance of the amplitude in the frequency range in an interval ±2 Hz around the excitation frequency of 50 Hz.

FIG. 9 shows a detection of the operating state from the variance of the amplitude in the frequency range in an interval ±2 Hz around an excitation frequency of 50 Hz. Here, thresholding is used to detect the operating state. In the embodiment shown in FIG. 9, a variance greater than 10000 is defined for the detection of the "idling" operating state and a variance greater than 100000 is defined for the detection of the "load run" operating state. In FIG. 9, the variance has been normalized to the mean value of the examined amplitude spectrum in the respective time window. In FIG. 8, this time window is one second.

Figures 10A, 10B, 10C:
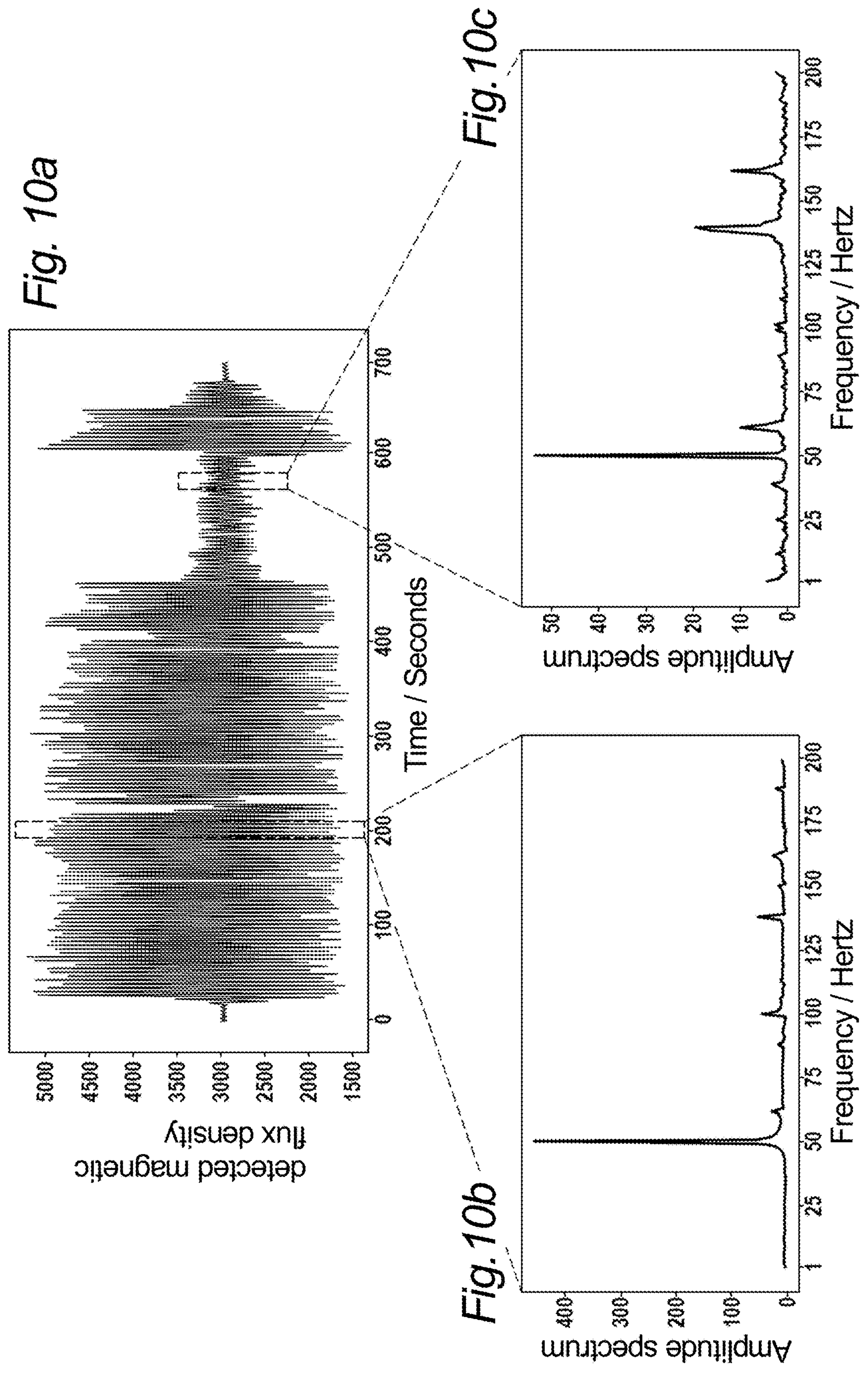
FIG. 10 shows the detection of the operating state from the detected magnetic flux density (FIG. 10*a*) in the operating mode “load run” (FIG. 10*b*) and in the operating mode “idling” (FIG. 10*c*)

FIG. 10 shows the underlying data for detecting the operating state by means of two different procedures from the recorded magnetic flux density (FIG. 10*a*). Two time ranges are defined by way of example in FIG. 10*a*. The amplitude spectrum after a Fourier analysis (here Fast Fourier Transform FFT) is shown for these two time ranges in FIG. 10*b* and FIG. 10*c*. The two time ranges differ with regard to the operating state of the compressor: "Load run" (FIG. 10*b*) and "idling" (FIG. 10*c*).

In particular, FIG. 10 shows another possibility for detecting the operating state, wherein the magnetic field of all phases L1, L2, L3 of the power supply cable 4 is detected. This method is suitable both for compressors 1 with frequency converter 10 (see for example FIG. 2 or FIG. 6) and for compressors 1 without frequency converter 10 (see for example FIG. 1 or FIG. 4). Based on the magnetic flux density detected by means of the detection element 3 (shown by way of example in FIG. 10*a*), the amplitude spectrum can be calculated for certain time sections. This is exemplified for a 1 s time interval in the load run in FIG. 10*b* and for a 1 s time interval in the idling operation in FIG. 10*c*. Based on the amplitude values of the frequency 50 Hz (shown by way of example in FIG. 11*a*) the operating state (shown by way of example in FIG. 11*b*) is determined by means of threshold values. Since this application example involves a fixed-speed compressor which is operated in a power grid with 50 Hz network frequency, the amplitude values of the 50 Hz frequency are particularly relevant for this application example.

Figure 11A:
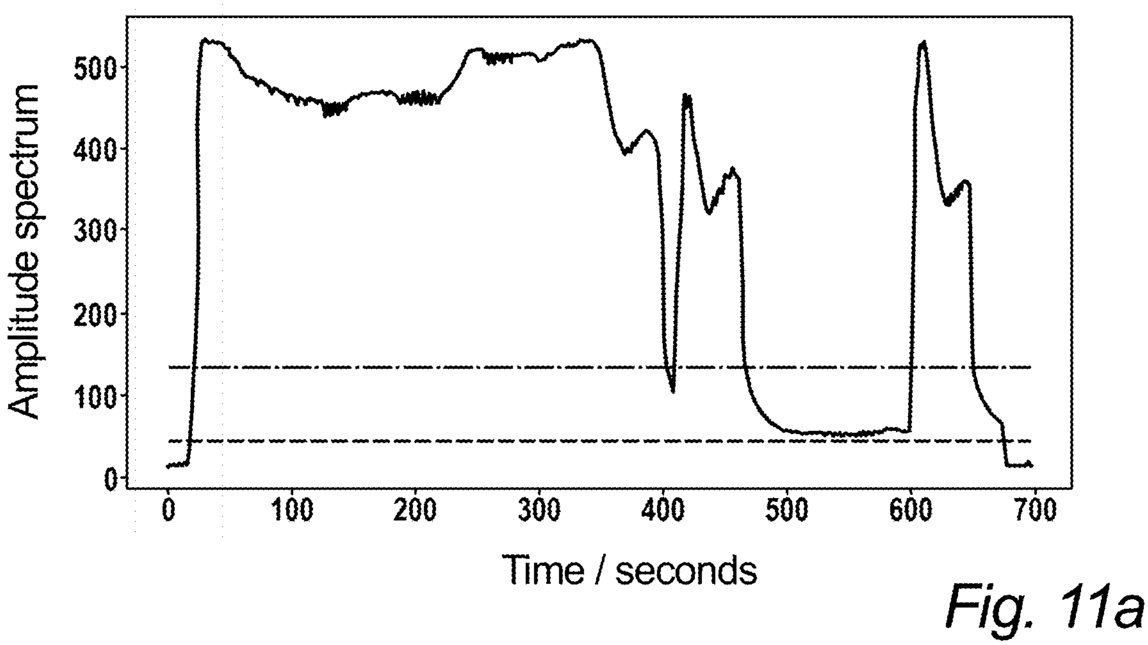
FIGS. 11*a-b* show a detection of the operating state based on the amplitude of an FFT for the mains frequency.
Figure 11B:
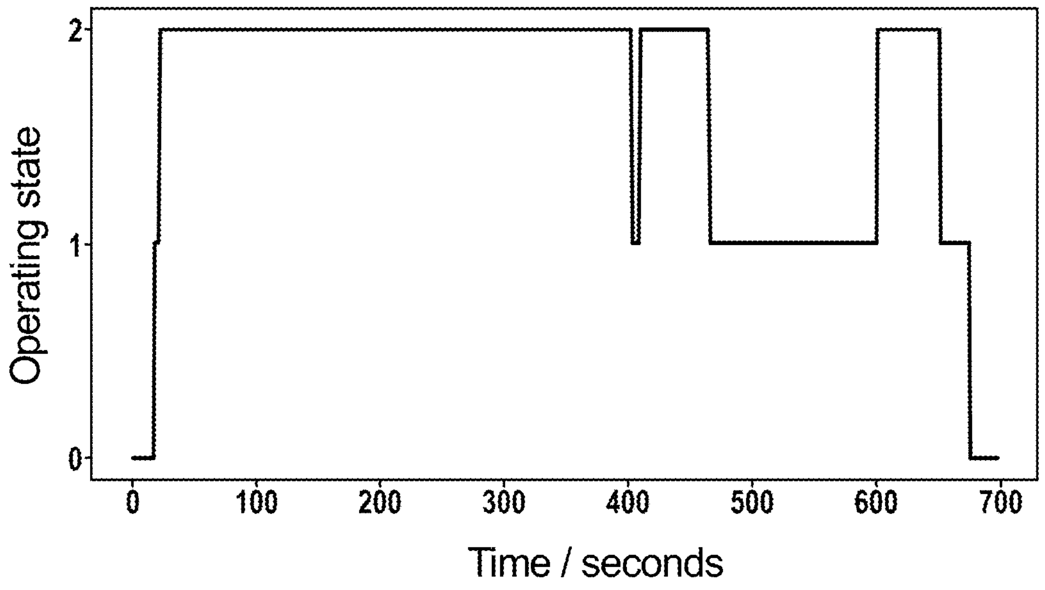

Two different procedures can be used to determine the threshold values. For the first procedure, the operating state must be known at a point in time of the measurement (e.g. "idling" at 530 s in FIG. 10 or 11). For this point in time the amplitude value of the frequency at 50 Hz is known. This amplitude value is multiplied by a first safety factor (for example 0.8) to obtain the lower threshold value. Multiplication by a second safety factor (for example 1.5) defines the upper threshold. If at any time the amplitude value of the frequency at 50 Hz is greater than both threshold values, the operating state is "load run". If at any time the amplitude value of the frequency at 50 Hz is less than both threshold values, the operating state is "off". If at any time the amplitude value of the frequency at 50 Hz is between the two threshold values, the operating state is "idling". Using these two threshold values, the operating state can be determined for each time step, this is shown in FIG. 11*b*.

The second procedure for determining the threshold values runs automatically and therefore does not require any information about an operating state at a specific point in time. In both the "idling" and "load run" operating states, the excitation frequency of the magnetic field is more than 6 Hz. In the "off" operating state, on the other hand, excitation frequencies are detected which are below 6 Hz. Therefore, times with an excitation frequency lower than 6 Hz can be defined as operating state. Before a compressor changes to the "off" operating state, the "idling" operating state is run through for a few seconds. A similar behavior occurs when starting the compressor from "off" via "idling" to "load run". This phenomenon can be used to obtain amplitude value of frequency at 50 Hz for an "idling" operating state. In the second procedure, the mean value of the amplitude value of the frequency at 50 Hz of 4 time steps before a known "off" operating state is formed. This mean value is multiplied by a first safety factor (for example 0.8) to obtain the lower threshold value. Multiplication by a second safety factor (for example 1.5) defines the upper threshold. If at any time the amplitude value of the frequency at 50 Hz is greater than both threshold values, the operating state is "load run". If at any time the amplitude value of the frequency at 50 Hz is less than both threshold values, the operating state is "off". If at any time the amplitude value of the frequency at 50 Hz is between the two threshold values, the operating state is "idling". Using these two threshold values, the operating state can be determined for each time step, this is shown in FIG. 11*b*.

Figure 12A:
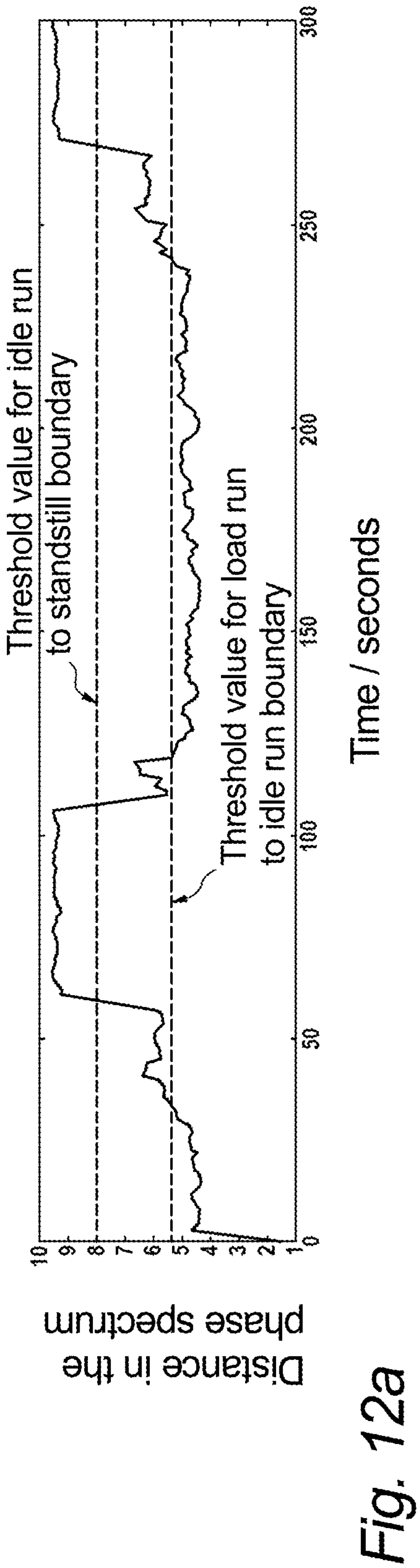
FIGS. 12*a-b* show a detection of the operating state based on the values of the phase spectrum.
Figure 12B:
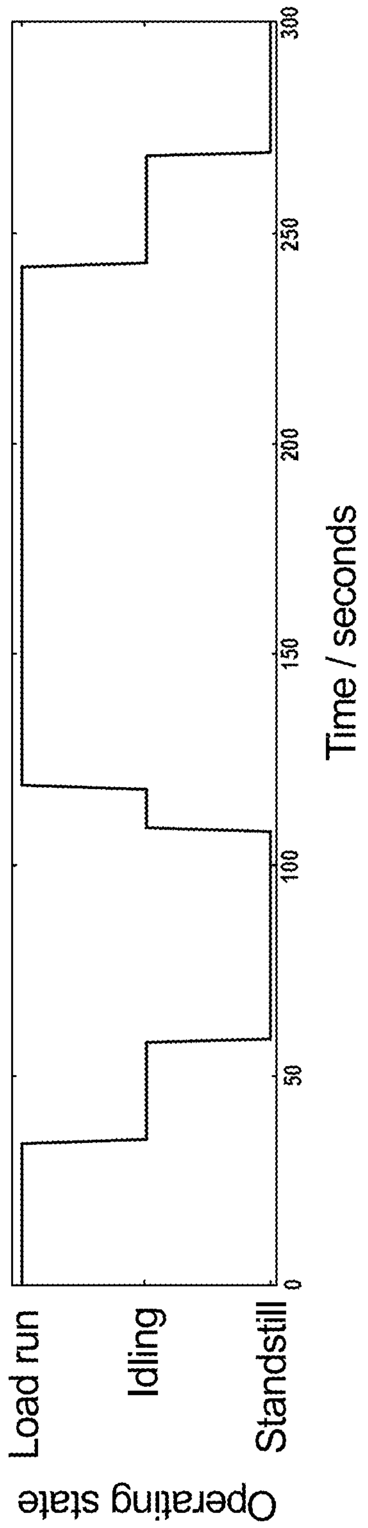

FIGS. 12*a* and 12*b* show another way of detecting the operating state, in which the magnetic field of all phases L1, L2, L3 of the power supply cable 4 is detected. This method is suitable both for compressors 1 with frequency converter 10 (see for example FIG. 2 or FIG. 6) and for compressors 1 without frequency converter 10 (see for example FIG. 1 or FIG. 4).

Based on the phase spectrum in the frequency range between 1 and 80 Hz (see FIG. 8), all values of the phase spectrum can be summed up in time ranges of, for example, 1 s.

The difference of these summed values of the arguments is formed. If this difference is >0.1 rad, this difference is limited to 0.1 rad. A new time series of the differences is created.

After smoothing the time series of differences (for example by forming the mean value over three adjacent values), threshold values can be defined for a change of the "idling", "load run" and "standstill" operating states. This time series of differences is called the path in the phase spectrum. This course of the path in the phase spectrum and the associated threshold values are shown in FIG. 12*a*. The operating state of the compressor determined from this is shown in FIG. 12*b*.

Figure 13:
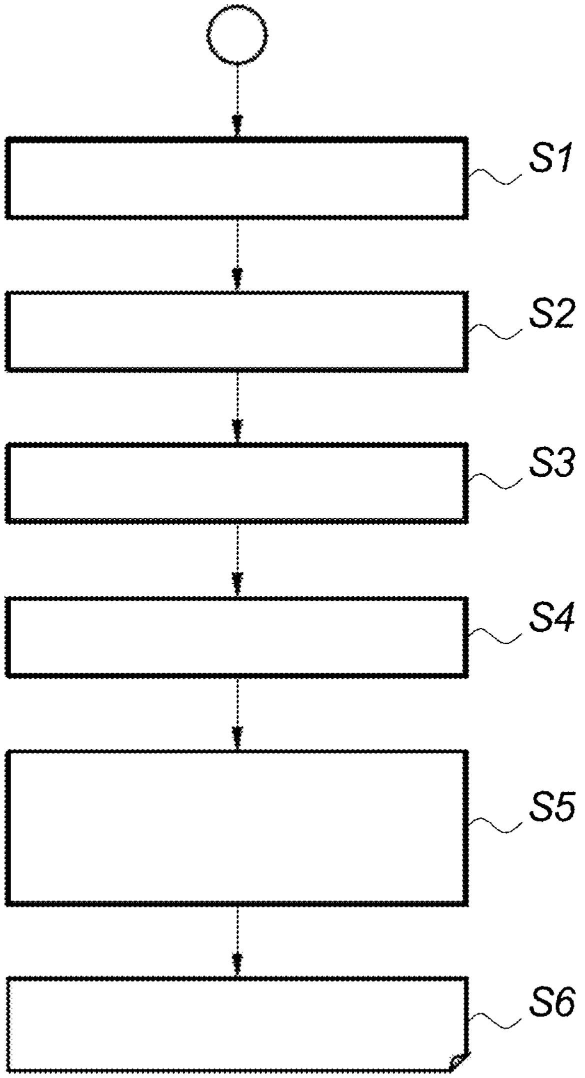
FIG. 13 shows a possible sequence of the method according to the disclosure.

FIG. 13 shows a possible sequence of the method according to the disclosure. In a first step, S1, the measurement is started. Then, in a second step, S2, the magnetic field values are acquired by scanning and stored. Subsequently, in a third step, S3, the measurement is stopped. In a fourth step, S4, the time series of the magnetic field values is read out. In a fifth step, S5, the rotational speed and the operating state are determined in sections of one second at a time by frequency analysis. In a sixth step, S6, time series of rotational speed and operating state are obtained.

Individual application examples are discussed in more detail below with reference to FIGS. 14 to 17.

Application Example 1

Figure 14:
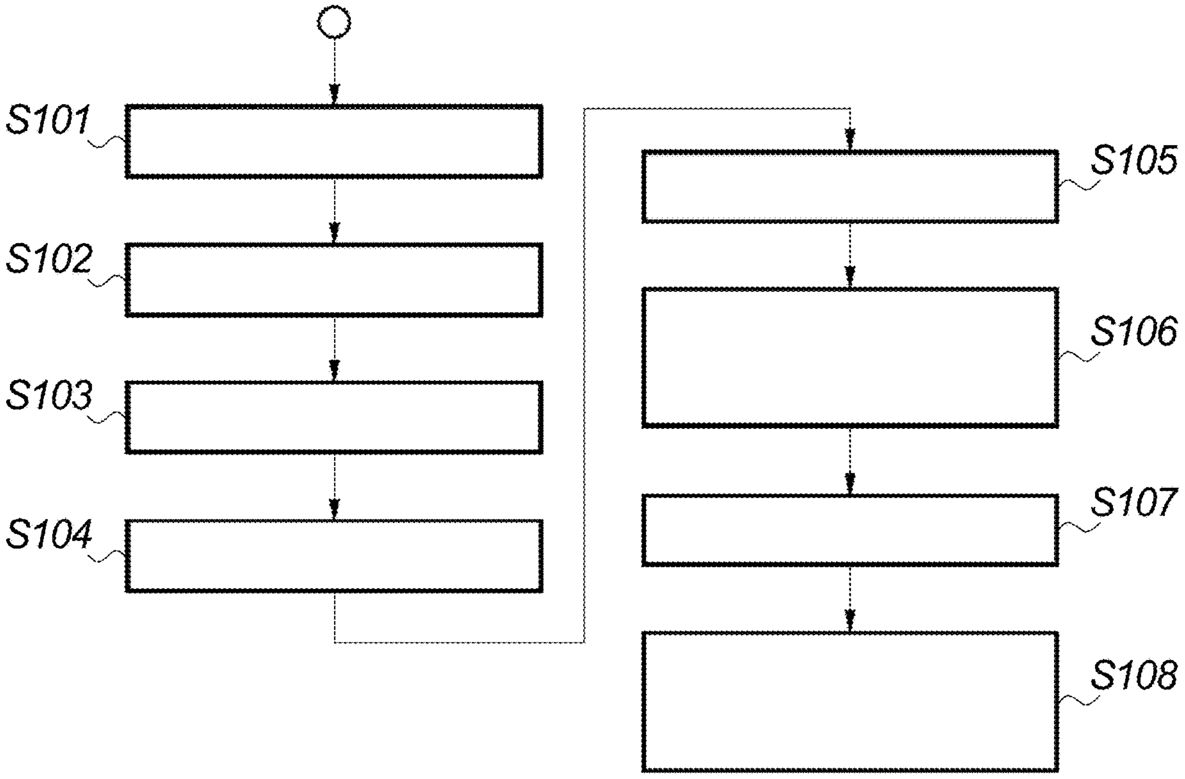
FIG. 14 shows a first possible implementation of the method according to the disclosure.

FIG. 14 shows a first possible implementation of the method according to the disclosure. In a first step, S101, the measurement is started. Then, in a second step, S102, the magnetic field values are acquired by scanning and stored. Then, in a third step, S103, the measurement is stopped. In a fourth step, S104, the time series of the magnetic field values is read out. In a fifth step, S105, the X, Y and Z values of the magnetic flux density (present as a time series) are further used. For each time point in the time series, the X, Y and Z values are combined into a vector and this vector is mapped to a scalar for that time point. Subsequently in step S106, the determination of the frequency spectrum on the time series of scalars is carried out by performing a frequency analysis with the Görtzel algorithm for each Is segment of the above time series. Then, the variance of the amplitudes of the frequency spectrum between 48 Hz and 52 Hz is formed. In step S107 an additional normalization of the variance value is performed using the average of the amplitudes. The normalized variance values are shown in FIG. 9, and the time window is one second. Finally, in step S108, threshold values for the normalized variance values are determined in order to distinguish the "load run", "idling" and "off" operating states. In the embodiment illustrated in FIG. 8, a variance greater than 10000 is defined for detecting the "idling" operating state and a variance greater than 100000 is defined for detecting the "load run" operating state.

Application Example 2

Figure 15:
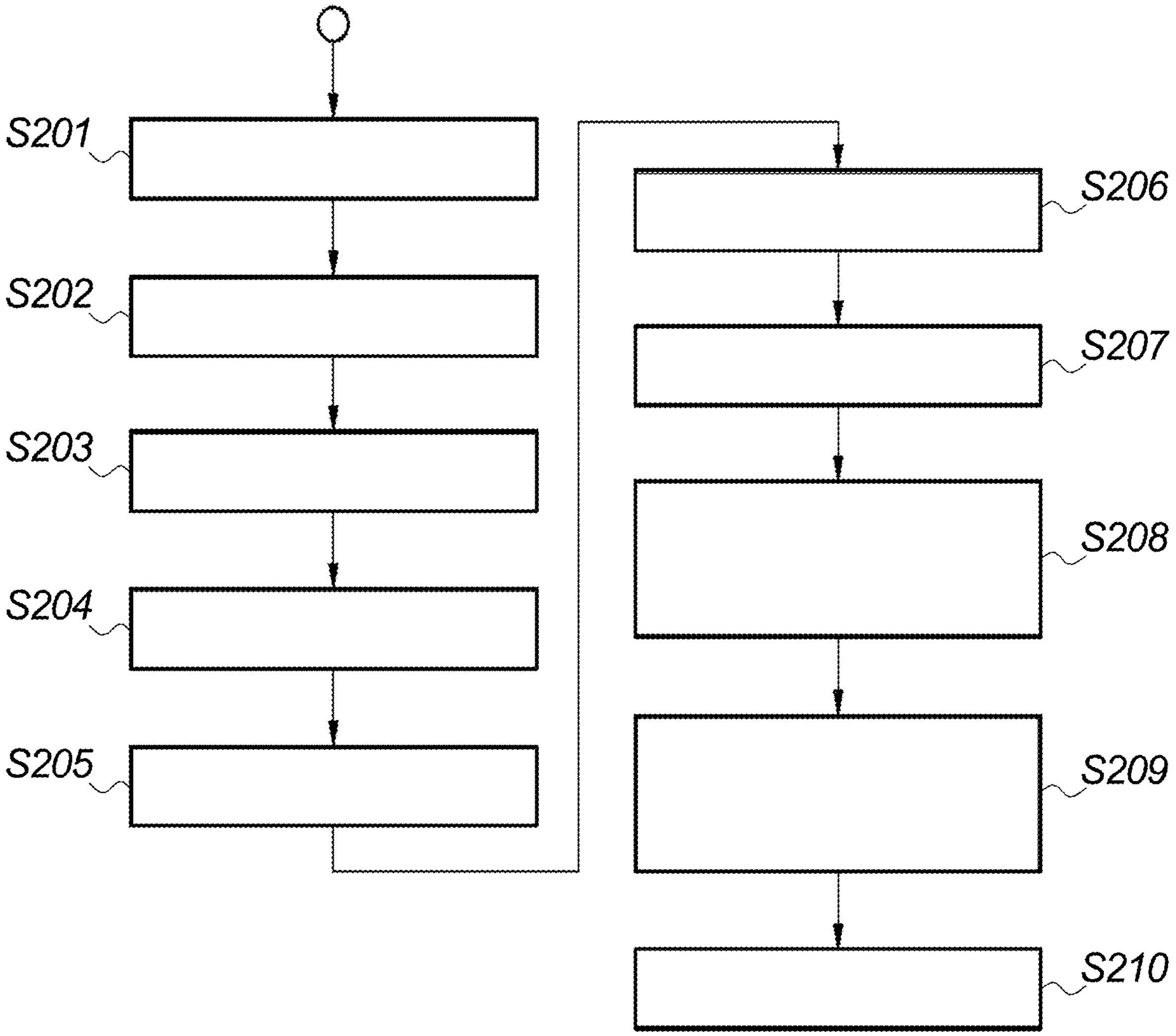
FIG. 15 shows a second possible implementation of the method according to the disclosure.

FIG. 15 shows a second possible implementation of the method according to the disclosure. In a first step, S201, the measurement is started. Then, in a second step, S202, the magnetic field values are acquired by scanning and stored. Then, in a third step, S203, the measurement is stopped. In a fourth step, S204, the time series of the magnetic field values is read out. In a fifth step, S205, the X, Y and Z values of the magnetic flux density (present as a time series) are further used. For each time point in the time series, the X, Y and Z values are combined into a vector and this vector is mapped to a scalar for that time point. The values of this scalar are shown in FIG. 9*a*. In a sixth step, S206, the frequency spectrum is determined on the time series of scalars by performing a frequency analysis using Fourier analysis (FFT) for each Is segment of the above time series and calculating the amplitude spectrum. Values of the amplitude spectrum are shown in FIGS. 10*b* and 10*c* for one second "load run" and one second "idling". Then, in step S207, the extraction of the amplitude at 50 Hz (excitation frequency) is performed for each 1 s interval. The amplitude values at 50 Hz are shown as a time series in FIG. 11*a*. Thereafter, in step S208, a time point with the compressor operating state "idling" can be identified by manual specification. In FIG. 11*a*, for example, at 530 s. Based on the magnitude value of the amplitude of the Fourier analysis at 50 Hz of the known time point "idling", the threshold value SW1 is formed, in step S209, by means of multiplication by a safety factor (e.g. 0.8) and the threshold value SW2 is formed by means of a second safety factor (e.g. 1.5). The safety factors are determined by measuring and analyzing a group of compressors. These two threshold values are shown as dashed lines in FIG. 11*a*. Finally, in step S210, all magnitude values of the amplitudes of the Fourier analysis at 50 Hz that are above the two thresholds are assigned to the "load run" operating state, all values below the two thresholds are assigned to the "off" operating state and all values between the two thresholds are assigned to the "idling" operating state. This results in the curve of the operating states of the compressor, shown in FIG. 11*b*.

Application Example 3

Figure 16:
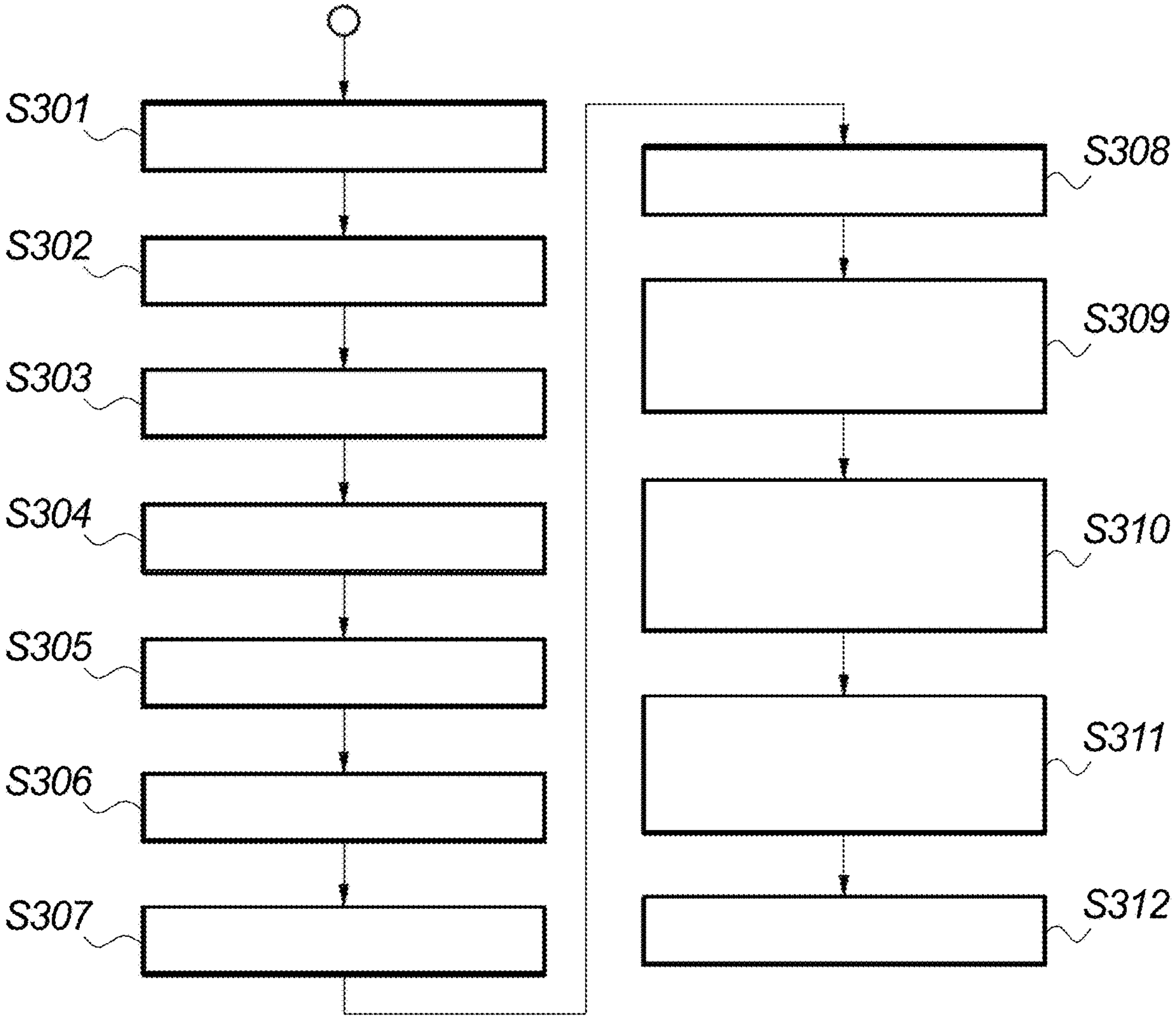
FIG. 16 shows a second possible implementation of the method according to the disclosure.

FIG. 16 shows a third possible implementation of the method according to the disclosure. In a first step, S301, the measurement is started. Then, in a second step, S302, the magnetic field values are acquired by scanning and stored. Then, in a third step, S303, the measurement is stopped. In a fourth step, S304, the time series of the magnetic field values is read out. In a fifth step, S305, the X, Y and Z values of the magnetic flux density (present as a time series) are further used. For each time point in the time series, the X, Y and Z values are combined into a vector and this vector is mapped to a scalar for that time point. The values of this scalar are shown in FIG. 9*a*. In a sixth step, S306, the frequency spectrum is determined on the time series of scalars by performing a frequency analysis with Fourier analysis (here using FFT) for each Is segment of the above time series and calculating the amplitude spectrum. Values of the amplitude spectrum are shown in FIGS. 10*b* and 10*c* for one second "load run" and one second "idling". Then, in step S307, the extraction of the amplitude at 50 Hz (excitation frequency) is performed for each 1 s interval. The amplitude values at 50 Hz are shown as a time series in FIG. 11*a*. In step S308, the "off" operating state of the compressor can be detected. In the "off" operating state of the compressor, the Fourier analysis delivers very small frequencies (<6 Hz) as a frequency with maximum amplitude greater than 0 Hz (DC component). Time intervals in which this is the case can be automatically assigned to the "off" operating state. In step 309, a time interval is searched for at which the compressor has just changed to the known "off" operating state determined by the above method step (e.g. time point 680 s in FIG. 11*a*). A few seconds before the determined time interval, compressors may be assumed to be in the "idling" operating state. Therefore, in step S310, the average of the magnitude values of the amplitude of the Fourier analysis at 50 Hz over 4 seconds before the time interval in which the system is safely in the "off" state is formed. In FIG. 11*a*, this is the mean value of the values 676 s-679 s. Subsequently, in step S311, starting from the determined mean value, the threshold value SW1 is formed by means of multiplication by a safety factor (e.g. 0.8) and the threshold value SW2 is formed by means of a second safety factor (e.g. 1.5). The safety factors are determined by measuring and analyzing a group of compressors. These two threshold values are shown in FIG. 11*a*. Finally, in step S312, all the magnitude values of the amplitudes of the Fourier analysis at 50 Hz which are above the two thresholds are assigned to the "load run" operating state, all the values below the two thresholds are assigned to the "off" operating state and all the values between the two thresholds are assigned to the "idling" operating state. This results in the curve of the operating states shown in FIG. 11*b*.

Application Example 4

Figure 17:
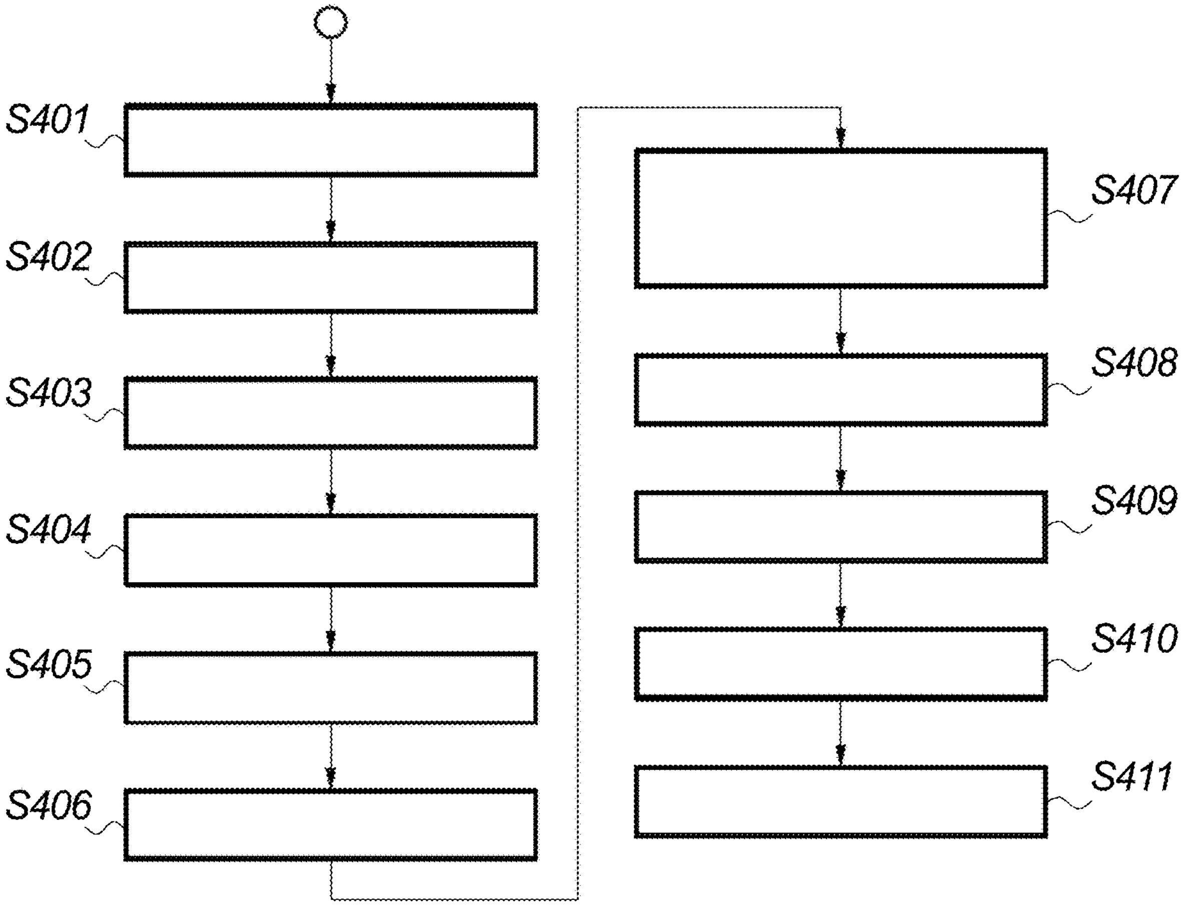
FIG. 17 shows a fourth implementation of the method according to the disclosure.

FIG. 17 shows a fourth possible implementation of the method according to the disclosure. In a first step, S401, the measurement is started. Then, in a second step, S402, the magnetic field values are acquired by scanning and stored. Then, in a third step, S403, the measurement is stopped. In a fourth step, S404, the time series of the magnetic field values is read out. In a fifth step, S405, the X, Y and Z values of the magnetic flux density (present as a time series) are further used. For each time point in the time series, the X, Y and Z values are combined into a vector and this vector is mapped to a scalar for that time point. In a sixth step, S406, the frequency spectrum is determined on the time series of scalars by performing a frequency analysis with Fourier analysis (here using FFT) for each 1 s segment of the above time series and calculating the argument/phase in rad. In a seventh step, S407, the difference of two adjacent values of the arguments is formed. If this difference is >0.1 rad, this difference is limited to 0.1 rad. A new time series of the differences is formed. Subsequently, in step S408, the formation of the sum of all differences of the arguments in rad in the frequency range of 1-80 Hz takes place, this is called the distance in the phase spectrum. In the ninth step, S409, the curve of the distance in the phase spectrum is smoothed (for example, by taking the mean value of 3 values of the distance in the phase spectrum). This distance in the phase spectrum is shown in FIG. 12*a*. Next, in step S410, threshold values are set to distinguish the operating states, threshold values are shown as a dashed line in FIG. 12*a*. In the last step, S411, all values of the distance in the phase spectrum which lie above the two threshold values are assigned to the "load run" operating state, all values below the two threshold values are assigned to the "off" operating state and all values between the two threshold values are assigned to the "idling" operating state. This results in the curve of the operating states as a time series of the compressor in FIG. 12*b*.

Figure 18:
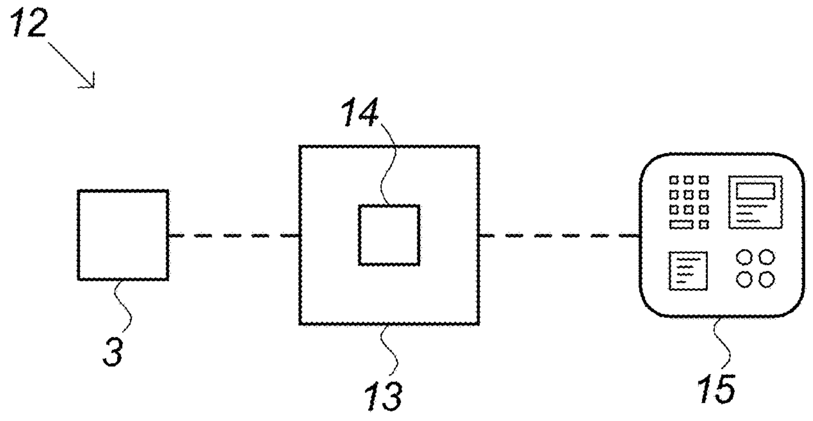
FIG. 18 shows a compressor measuring system according to the disclosure.

FIG. 18 shows a compressor measuring system 12 according to an embodiment of the disclosure. The compressor measuring system 12 comprises a detection element 3, e.g. a detection element explained in FIGS. 4-6, a spectrum analyzer 14 comprising a computer processing arrangement in the form of a processor 13, and a user interface 15. The spectrum analyzer 13 is communicatively coupled to the detection element 3 and is configured to automatically analyze a frequency spectrum of a representation of a magnetic field over a time range by means of computer-implemented software code according to the provisions of the disclosure run by said processor 13. This representation is provided on the basis of measurements performed by the detection element 3 in accordance with any of the above provisions. The spectrum analyzer is thereby configured to determine an operating state of the compressor 1 and/or to determine a rotational speed of the compressor drive 2. The user interface 15 of this embodiment of the disclosure may be e.g. a graphical user interface. The user interface 15 is communicatively associated with the spectrum analyzer 13 and thereby configured to automatically communicating the determined operating state of the compressor 1 and/or the rotational speed of the compressor drive 2 to the user interface 15. Thereby a user of the compressor measuring system can be informed about the operating state of the compressor 1 and/or the rotational speed of the compressor drive 2. The compressor measuring system 12 according to this embodiment of the disclosure may be operated in accordance with any of the above provisions concerning a method for determination of an operating state of a compressor 1 and/or a rotational speed of a compressor drive 2 of the compressor 1.

The invention claimed is:

1. A method for determining an operating state of a compressor or a rotational speed of a compressor drive of the compressor, the method comprising:

detecting a magnetic field associated with at least one phase of a motor lead of an electric motor of the compressor drive using a detection element attached to the motor lead, the motor lead supplying electrical power to the electric motor to drive the compressor, wherein the magnetic field is detected over a time range;

determining a frequency spectrum of the magnetic field over the time range; and analyzing the frequency spectrum of the magnetic field over the time range to determine the operating state of the compressor or the rotational speed of the compressor drive.

2. The method of claim 1, wherein the method further comprises attaching the detection element directly on the electric motor.

3. The method of claim 1, wherein the method further comprises attaching the detection element inside the electric motor.

4. The method of claim 1, wherein the method further comprises attaching the detection element to all phases of the motor lead.

5. The method of claim 4, wherein detecting the magnetic field further comprises measuring the magnetic field generated by all phases of the motor lead.

6. The method of claim 1, wherein the method further comprises attaching the detection element to a neutral conductor in the motor lead.

7. The method of claim 6, wherein detecting the magnetic field comprises measuring the magnetic field in the neutral conductor generated by leakage currents between the neutral conductor and individual phases of the motor lead.

8. The method of claim 1, wherein the detection element comprises:

a first sensor for detecting a magnetic field strength in an X-direction;

a second sensor for detecting a magnetic field strength in a Y-direction; and a third sensor for detecting a magnetic field strength in a Z-direction.

9. The method of claim 1, wherein:

the detection element comprises a Rogowski coil; and detecting the magnetic field comprises inductively measuring changes in a magnetic field strength using the Rogowski coil.

10. The method of claim 1, wherein:

the detection element comprises a Hall effect sensor; and detecting the magnetic field comprises measuring a magnetic flux density using the Hall effect sensor.

11. A compressor comprising:

a compressor drive comprising an electric motor, the electric motor comprising a motor lead having a plurality of phases;

a power supply cable in communication with the plurality of phases of the motor lead to supply electrical power to the electric motor to drive the compressor;

a detection element attached to the motor lead and positioned to detect a magnetic field associated with at least one of the plurality of phases of the motor lead; and a machine controller in communication with the compressor drive and the detection element, the machine controller receiving the magnetic field detected by the detection element over a time range, determining a frequency spectrum of the magnetic field over the time range, and analyzing the frequency spectrum of the magnetic field over the time range to determine an operating state of the compressor or a rotational speed of the compressor drive.

12. The compressor of claim 11, wherein the detection element is directly attached to the electric motor.

13. The compressor of claim 11, wherein the detection element is disposed inside the electric motor.

14. The compressor of claim 11, wherein the detection element is positioned to measure the magnetic field generated by all phases of the motor lead.

15. The compressor of claim 11, wherein the detection element is attached to a neutral conductor in the motor lead to measure the magnetic field in the neutral conductor generated by leakage currents between the neutral conductor and individual phases of the motor lead.

16. The compressor of claim 11, wherein the detection element comprises:

a first sensor for detecting a magnetic field strength in an X-direction;

a second sensor for detecting a magnetic field strength in a Y-direction; and a third sensor for detecting a magnetic field strength in a Z-direction.

17. The compressor of claim 11, wherein the detection element comprises a Rogowski coil or a Hall effect sensor.

18. A method for determining an operating state of a compressor or a rotational speed of a compressor drive of the compressor, the method comprising:

detecting a magnetic field associated with at least one phase of current supplied to a motor lead of an electric motor of the compressor drive using a detection element attached to the motor lead, a power supply supplying electrical power to the electric motor to drive the compressor, wherein the magnetic field is detected over a time range;

determining a frequency spectrum of the magnetic field over the time range; and using a clustering method and a classification method to determine the operating state of the compressor.

19. The method of claim 18, wherein using the clustering method and the classification method comprises:

determining a phase spectrum for a frequency range in the frequency spectrum;

forming a variance of the phase spectrum in the frequency range; and feeding the variance into a clustering algorithm.

20. The method of claim 19, wherein using the clustering method and the classification method further comprises:

using thresholds in the clustering algorithm to define clusters;

using the clusters in the classification method to assign an operational state to each cluster based on the variance.

* * * * *